US012346021B2

(12) United States Patent
Hsu et al.

(10) Patent No.: US 12,346,021 B2
(45) Date of Patent: Jul. 1, 2025

(54) SIMULTANEOUS CARBON NANOTUBE GROWTH, CATALYST REMOVAL, BORON NITRIDE NANOTUBE SHELL FORMATION METHOD FOR EUV PELLICLES

(71) Applicant: Taiwan Semiconductor Manufacturing Co., Ltd., Hsinchu (TW)

(72) Inventors: Pei-Cheng Hsu, Hsinchu (TW); Huan-Ling Lee, Hsinchu (TW); Hsin-Chang Lee, Hsinchu (TW); Chin-Hsiang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 636 days.

(21) Appl. No.: 17/749,675

(22) Filed: May 20, 2022

(65) Prior Publication Data

US 2023/0236496 A1 Jul. 27, 2023

Related U.S. Application Data

(60) Provisional application No. 63/301,937, filed on Jan. 21, 2022.

(51) Int. Cl.
*G03F 1/62* (2012.01)
(52) U.S. Cl.
CPC ...................................... *G03F 1/62* (2013.01)
(58) Field of Classification Search
CPC ..................................... G03F 1/62; G03F 1/64
USPC ............................................................ 430/5
See application file for complete search history.

(56) References Cited

U.S. PATENT DOCUMENTS

| 11,860,534 | B2 * | 1/2024 | Chao | G03F 1/62 |
| 12,153,339 | B2 * | 11/2024 | Hsu | G03F 1/82 |
| 12,174,526 | B2 * | 12/2024 | Chao | G03F 1/62 |
| 2016/0351839 | A1 | 12/2016 | Niori | |

FOREIGN PATENT DOCUMENTS

| CN | 108663898 A | 10/2018 |
| JP | 4493344 B2 | 6/2010 |
| KR | 20180084651 A | 7/2018 |
| KR | 102194012 B1 | 12/2020 |
| KR | 20210116770 A | 9/2021 |
| KR | 2021-0118959 A | 10/2021 |
| TW | 201411297 A | 3/2014 |
| TW | 201440204 A | 10/2014 |
| TW | 201807507 A | 3/2018 |
| TW | 202010861 A | 3/2020 |
| TW | 202111775 A | 3/2021 |
| TW | 202122908 A | 6/2021 |

* cited by examiner

*Primary Examiner* — Christopher G Young
(74) *Attorney, Agent, or Firm* — Seed IP Law Group LLP

(57) ABSTRACT

A method for forming a pellicle for an extreme ultraviolet lithography is provided. The method includes forming a pellicle membrane over a filter membrane and transferring the pellicle membrane from the filter membrane to a membrane border. Forming the pellicle membrane includes growing carbon nanotubes (CNTs) from in-situ formed metal catalyst particles in a first reaction zone of a reactor, each of the CNTs including a metal catalyst particle at a growing tip thereof, growing boron nitride nanotubes (BNNTs) to surround individual CNTs in a second reaction zone of the reactor downstream of the first reaction zone, thereby forming heterostructure nanotubes each including a CNT core and a BNNT shell, and collecting the heterostructure nanotubes on the filter membrane. The metal catalyst particles are partially or completely removed during growing the BNNTs.

20 Claims, 20 Drawing Sheets

SIMULTANEOUS CARBON NANOTUBE GROWTH, CATALYST REMOVAL, BORON NITRIDE NANOTUBE SHELL FORMATION METHOD FOR EUV PELLICLES

PRIORITY CLAIM AND CROSS-REFERENCE

This application claims the benefit of U.S. Provisional Patent Application No. 63/301,937, filed Jan. 21, 2022, which is incorporated by reference herein in its entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
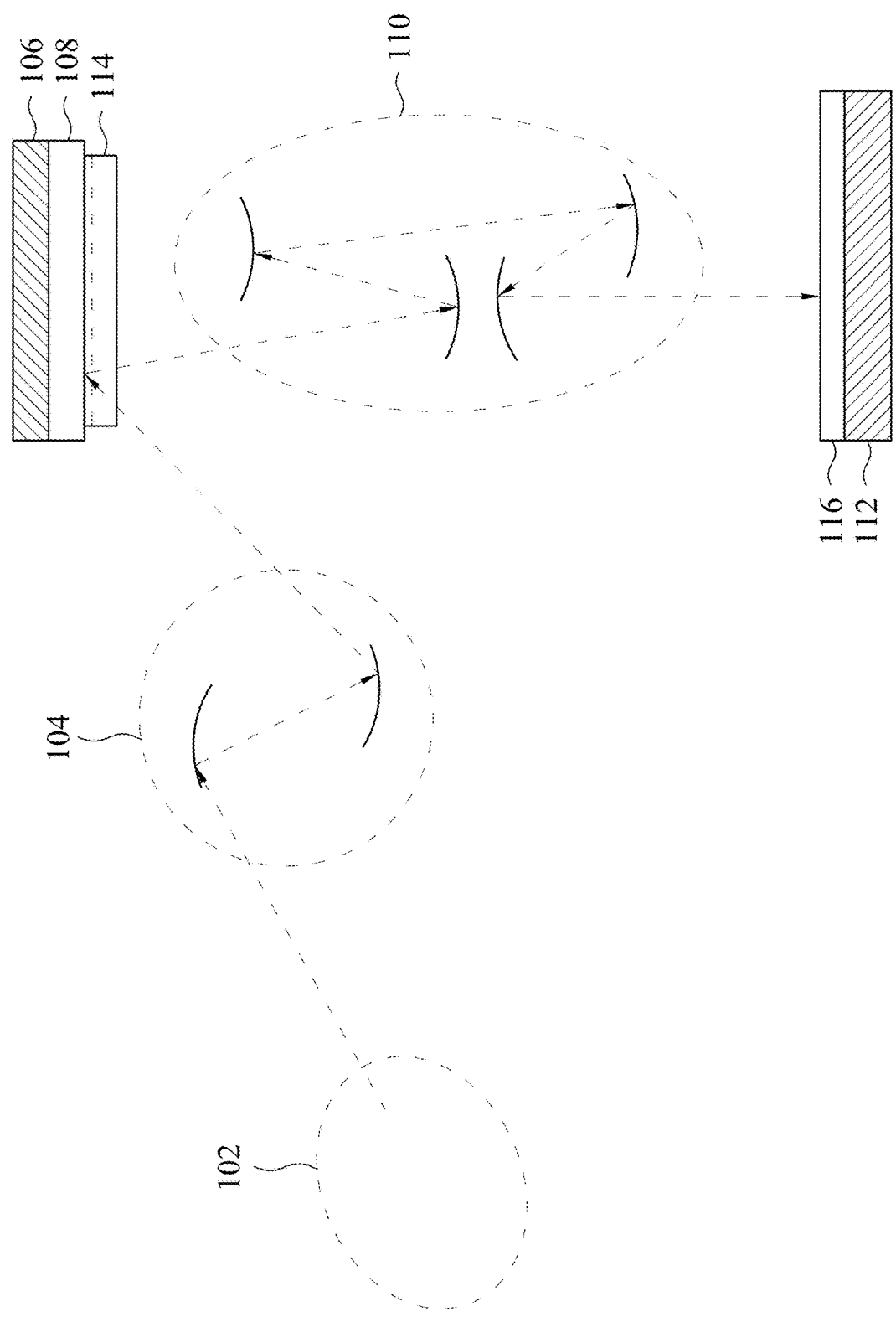
FIG. 1 is a schematic diagram of a lithography system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor fabrication, various lithographic processes are extensively used in the course of defining devices and circuit patterns. Depending on the size of the features to be defined, different optical lithographic processes may be used. In a lithographic process, a pattern present on a photomask or reticle may be transferred to a light-sensitive photoresist coating by illuminating the photomask. The light is modulated by the reticle pattern and imaged onto a photoresist-coated wafer. In general, as the patterns become smaller, shorter wavelengths are utilized. In extreme ultraviolet (EUV) lithography, a wavelength of about 13.5 nm is frequently used to produce feature sizes of less than 32 nanometers.

However, EUV systems, which utilize reflective rather than conventional refractive optics, are very sensitive to contamination issues. In one example, particle contamination introduced onto a reflective EUV mask can result in significant degradation of the lithographically transferred pattern. As such, it is necessary to provide a pellicle membrane over an EUV mask, to serve as a protective cover which protects the EUV mask from damage and/or contaminant particles. Additionally, to avoid a drop on reflectivity, it is important to use a thin, high-transmission material as the pellicle membrane.

Carbon nanotubes (CNTs), being transparent enough to limit the imaging impact while robust enough to survive handling and capable of stopping particles from falling on the photomask, have been used as pellicle membrane materials for EUV lithography. However, CNTs are vulnerable to the hydrogen plasma environment of the EUV scanner during a large number of exposure, e.g., on the order of tens of thousands or more. A carbon nanotube with a protective shell can provide high transmission of EUV radiation.

Embodiments of the present disclosure provide methods of manufacturing a pellicle membrane formed of a network of heterostructure nanotubes. The heterostructure nanotube has a core-shell structure including a CNT as the core and a boron nitride nanotube (BNNT) as the shell. The boron nitride has higher chemical and thermal stabilities than the carbon, and thus helps to prevent damages of the carbon nanotube core by EUV exposure and hydrogen flow. The methods of the present disclosure allow growing the CNT core and BNNT shell using chemical vapor deposition (CVD) processes with metal catalyst particles being removed simultaneously. As a result, the EUV transmission, reliability and lifespan of the pellicle membrane are improved.

FIG. 1 is a schematic diagram of a lithography system 100, in accordance with some embodiments of the present disclosure. The lithography system 100 may also be referred to herein as a "scanner" that is operable to perform lithography exposing processes with respective radiation sources and exposure modes.

In some embodiments, the lithography system 100 includes a high-brightness light source 102, an illuminator 104, a mask stage 106, a photomask 108, a projection optics module 110, and a substrate stage 112. In some embodiments, the lithography system may include additional components that are not illustrated in FIG. 1. In further embodiments, one or more of the high-brightness light source 102, the illuminator 104, the mask stage 106, the photomask 108, the projection optics module 110, and the substrate stage 112 may be omitted from the lithography system 100 or may be integrated into combined components.

The high-brightness light source 102 may be configured to emit radiation having wavelengths in the range of approximately 1 nanometer (nm) to 250 nm. In some embodiments, the high-brightness light source 102 generates EUV light with a wavelength centered at approximately 13.5 nanometers; accordingly, the high-brightness light source 102 may also be referred to as an "EUV light source." However, it will be appreciated that the high-brightness light source 102 should not be limited to emitting EUV light. For instance, the high-brightness light source 102 may be utilized to perform any high-intensity photon emission from excited target material.

In embodiments, for example, where the lithography system 100 is a UV lithography system, the illuminator 104 comprises various refractive optical components, such as a single lens or a lens system comprising multiple lenses (zone plates). In embodiments, for example, where the lithography system 100 is an EUV lithography system, the illuminator 104 comprises various reflective optical components, such as a single mirror or a mirror system comprising multiple mirrors. The illuminator 104 may direct light from the high-brightness light source 102 onto the mask stage 106, and more particularly onto the photomask 108 that is secured onto the mask stage 106. In an example where the high-brightness light source 102 generates light in the EUV wavelength range, the illuminator 104 comprises reflective optics.

The mask stage 106 may be configured to secure the photomask 108. In some examples, the mask stage 106 may include an electrostatic chuck (e-chuck) to secure the photomask 108. This is because the gas molecules absorb EUV light, and the lithography system 100 for EUV lithography patterning is maintained in a vacuum environment to minimize EUV intensity loss. Herein, the terms "photomask," "mask," and "reticle" may be used interchangeably. In some embodiments, the photomask 108 is a reflective mask.

In some examples, a pellicle 114 may be positioned over the photomask 108, e.g., between the photomask 108 and the substrate stage 112. The pellicle 114 may protect the photomask 108 from particles and may keep the particles out of focus, so that the particles do not produce an image (which may cause defects on a wafer during the lithography process).

The projection optics module 110 may be configured for imaging the pattern of the photomask 108 onto a semiconductor wafer 116 secured on the substrate stage 112. In some embodiments, the projection optics module 110 comprises refractive optics (such as for a UV lithography system). In some embodiments, the projection optics module 110 comprises reflective optics (such as for an EUV lithography system). The light directed from the photomask 108, carrying the image of the pattern defined on the photomask 108, may be collected by the projection optics module 110. The illuminator 104 and the projection optics module 110 may be collectively referred to as an "optical module" of the lithography system 100.

In some embodiments, the semiconductor wafer 116 may be a bulk semiconductor wafer. For instance, the semiconductor wafer 116 may comprise a silicon wafer. The semiconductor wafer 116 may include silicon or another elementary semiconductor material, such as germanium. In some embodiments, the semiconductor wafer 116 may include a compound semiconductor. The compound semiconductor may include gallium arsenide, silicon carbide, indium arsenide, indium phosphide, another suitable material, or a combination thereof. In some embodiments, the semiconductor wafer 116 includes a silicon-on-insulator (SOI) substrate. The SOI substrate may be fabricated using a separation by implantation of oxygen (SIMOX) process, a wafer bonding process, another applicable process, or a combination thereof. In some embodiments, the semiconductor wafer 116 comprises an undoped substrate. However, in other embodiments, the semiconductor wafer 116 comprises a doped substrate, such as a p-type substrate or an n-type substrate.

In some embodiments, the semiconductor wafer 116 includes various doped regions (not shown) depending on the design requirements of the semiconductor device structure. The doped regions may include, for example, p-type wells and/or n-type wells. In some embodiments, the doped regions are doped with p-type dopants. For example, the doped regions may be doped with boron or boron fluoride. In other examples, the doped regions are doped with n-type dopants. For example, the doped regions may be doped with phosphor or arsenic. In some examples, some of the doped regions are p-doped and other doped regions are n-doped.

In some embodiments, an interconnection structure may be formed over the semiconductor wafer 116. The interconnection structure may include multiple interlayer dielectric layers, including dielectric layers. The interconnection structure may also include multiple conductive features formed in the interlayer dielectric layers. The conductive features may include conductive lines, conductive vias, and/or conductive contacts.

In some embodiments, various device elements are formed in the semiconductor wafer 116. Examples of the various device elements may include transistors (e.g., metal oxide semiconductor field effect transistors (MOSFETs), complementary metal oxide semiconductor (CMOS) transistors, bipolar junction transistors (BJTs), high-voltage transistors, high-frequency transistors, p-channel and/or n-channel field effect transistors (PFETs and/or NFETs), diodes, or other suitable elements. Various processes may be used to form the various device elements, including deposition, etching, implantation, photolithography, annealing, and/or other applicable processes.

The device elements may be interconnected through the interconnection structure over the semiconductor wafer 116 to form integrated circuit devices. The integrated circuit devices may include logic devices, memory devices (e.g., static random access memory (SRAM) devices), radio frequency (RF) devices, input/output (I/O) devices, system-on-chip (SoC) devices, image sensor devices, other applicable devices, or a combination thereof.

In some embodiments, the semiconductor wafer 116 may be coated with a resist layer that is sensitive to EUV light. Various components including those described above may be integrated together and may be operable to perform lithography exposing processes.

Figure 2A:
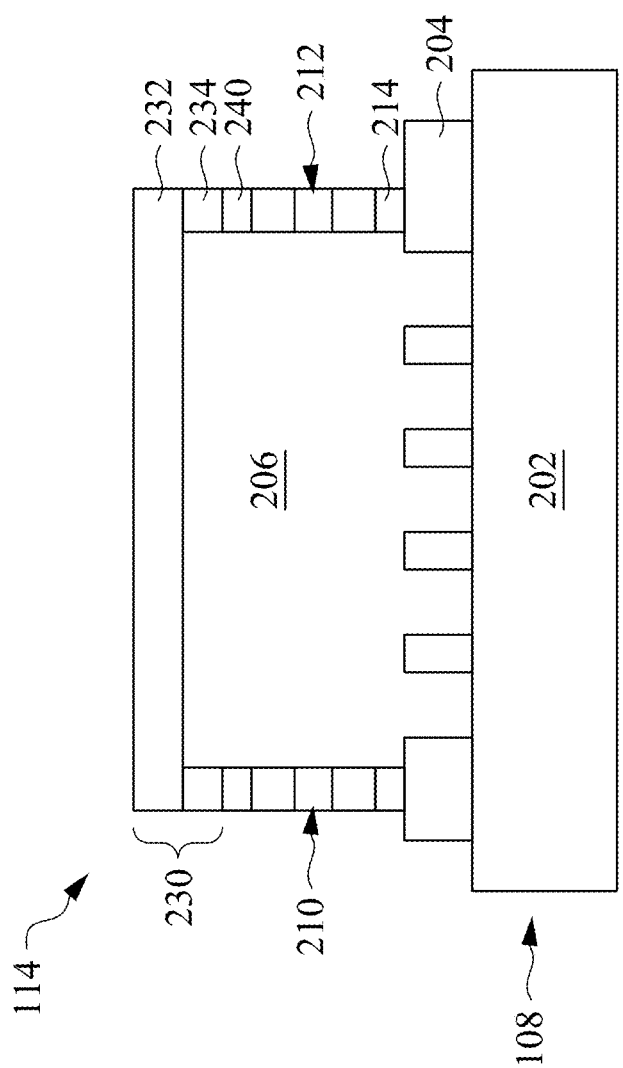
FIG. 2A is a cross-sectional view of a pellicle-photomask structure, in accordance with some embodiments of the present disclosure.

FIG. 2A is a cross-sectional view of a pellicle-photomask structure 200, in accordance with some embodiments of the present disclosure. As illustrated in FIG. 2A, the photomask 108 may include a mask substrate 202 and a mask pattern 204 positioned over the mask substrate 202.

In some examples, the mask substrate 202 comprises a transparent substrate, such as fused silica that is relatively free of defects, borosilicate glass, soda-lime glass, calcium fluoride, low thermal expansion material, ultra-low thermal expansion material, or other applicable materials. The mask pattern 204 may be positioned over the mask substrate 202 as discussed above and may be designed according to the integrated circuit features to be formed over a semiconductor substrate (e.g., semiconductor wafer 116 of FIG. 1) during a lithography process. The mask pattern 204 may be formed by depositing a material layer and patterning the material layer to have one or more openings where beams of radiation may travel through without being absorbed, and one or more absorption areas which may completely or partially block the beams of radiation.

The mask pattern 204 may include metal, metal alloy, metal silicide, metal nitride, metal oxide, metal oxynitride, or other applicable materials. Examples of materials that may be used to form the mask pattern 204 may include, but are not limited to, Cr, $Mo_xSi_y$, $Ta_xSi_y$, Mo, $Nb_xO_y$, Ti, Ta, $Cr_xN_y$, $Mo_xO_y$, $Mo_xN_y$, $Cr_xO_y$, $Ti_xN_y$, $Zr_xN_y$, $Ti_xO_y$, $Ta_xN_y$, $Ta_xO_y$, $Si_xO_y$, $Nb_xN_y$, $Zr_xN_y$, $Al_xO_yN_z$, $Ta_xB_yO_z$, $Ta_xB_yN_z$, $Ag_xO_y$, $Ag_xN_y$, Ni, $Ni_xO_y$, $Ni_xO_yN_z$, and/or the like. The compound x/y/z ratio is not limited.

In some embodiments, the photomask 108 is an EUV mask. However, in other embodiments, the photomask 108 may be an optical mask.

As illustrated in FIG. 2A, the pellicle 114 may be positioned over the photomask 108, thereby forming an enclosed inner volume 206 that is enclosed by the pellicle 114 and the photomask 108.

In some embodiments, the pellicle 114 includes a pellicle frame 210 that may be positioned over at least one of the mask substrate 202 and the mask pattern 204. The pellicle frame 210 may be designed in various dimensions, shapes, and configurations. In some embodiments, the pellicle frame 210 may have a round shape, a rectangular shape, or any other suitable shape. In some embodiments, the pellicle frame 210 may be formed from Si, SiC, SiN, glass, a low coefficient of thermal expansion material (such as an Al alloy, a Ti alloy, Invar, Kovar, or the like), another suitable material, or a combination thereof. In some embodiments, suitable processes for forming the pellicle frame 210 may include machining processes, sintering processes, photochemical etching processes, other applicable processes, or a combination thereof.

As further illustrated in FIG. 2A, the pellicle 114 may further include a vent structure 212 extending through the pellicle frame 210. In some embodiments, the vent structure 212 may comprise one or more apertures formed through the pellicle frame 210. The apertures may take any shape, including circular apertures, rectangular apertures, slit-shaped apertures, other shapes, or any combination thereof. The apertures may allow for a flow of air through a portion of the pellicle-photomask structure 200. In some embodiments, the apertures may include filters to minimize passage of outside particles through the vent structure 212. In some embodiments, the vent structure 212 may prevent the pellicle membrane from rupturing during the EUV lithography process.

As further illustrated in FIG. 2A, the pellicle frame 210 is attached to photomask 108 by a pellicle frame adhesive 214. In some embodiments, the pellicle frame adhesive 214 may be formed from a crosslink type adhesive, a thermoplastic elastomer type adhesive, a polystyrene type adhesive, an acrylic type adhesive, a silicon-based adhesive, an epoxy type adhesive, or a combination thereof.

In some embodiments, a surface treatment may be performed on the pellicle frame 210 to enhance the adhesion of the pellicle frame 210 to the pellicle frame adhesive 214. In some examples, the surface treatment may include an oxygen plasma treatment, another applicable treatment, or a combination thereof. However, in other examples, no surface treatment may be performed on the pellicle frame 210.

As further illustrated in FIG. 2A, the pellicle 114 may further include a pellicle membrane assembly 230 including a pellicle membrane 232 and a membrane border 234 positioned over the pellicle frame 210. The pellicle membrane 232 extends over the pattern region of the photomask 108 to protect the pattern region from contaminant particles. Particles unintentionally deposited on the pattern region of the photomask 108 may introduce defects and result in degradation of the transferred patterns. Particles may be introduced by any of a variety of ways, such as during, a cleaning process, and/or during handling of the photomask 108. By keeping the contaminant particles out of the focal plane of the photomask 108, a high fidelity pattern transfer from the photomask 108 to the semiconductor wafer 116 (FIG. 1) can be achieved.

As illustrated in FIG. 2A, a pellicle membrane adhesive 240 may be positioned between the membrane border 234 and the pellicle frame 210, attaching the pellicle membrane 232 to the pellicle frame 210. In some embodiments, the pellicle membrane adhesive 240 may be formed from a thermoplastic elastomer type adhesive, a polystyrene type adhesive, an acrylic type adhesive, a silicon-based adhesive, an epoxy type adhesive, another suitable adhesive, or a combination thereof. In some embodiments, the pellicle membrane adhesive 240 may be formed from a material that is different from the material making up the pellicle frame adhesive 214.

The membrane border 234 may be attached around the periphery of the pellicle membrane 232, and thus mechanically supports the pellicle membrane 232. The membrane border 234 may, in turn, be mechanically supported by the pellicle frame 210 when the pellicle-photomask structure 200 is fully assembled. That is, the pellicle frame 210 may mechanically support the membrane border 234 and the pellicle membrane 232 on the photomask 108.

In some embodiments, the membrane border 234 may be formed from Si. In further examples, the membrane border 234 may be formed from boron carbide, graphene, carbon nanotube, SiC, SiN, $SiO_2$, SiON, Zr, Nb, Mo, Cd, Ru, Ti, Al, Mg, V, Hf, Ge, Mn, Cr, W, Ta, Ir, Zn, Cu, F, Co, Au, Pt, Sn, Ni, Te, Ag, another suitable material, an allotrope of any of these materials, or a combination thereof.

In embodiments of the present disclosure, the pellicle membrane 232 is formed by one or more of heterostructure nanotube layers. Each heterostructure nanotube layer may include a random or regular web or grid of heterostructure nanotubes. FIG. 2B, for instance, illustrates an exemplary pellicle membrane 232 of FIG. 2A, in accordance with some embodiments of the present disclosure. In the example illustrated in FIG. 2B, the pellicle membrane 232 comprises a network of heterostructure nanotubes. The structure density of the heterostructure nanotube network is chosen to maximize EUV radiation transmission while minimizing passage of particles through the pellicle membrane 232. For example, in some embodiments, the network of heterostructure nanotubes making up the pellicle membrane 232 may have a structure density of between 0.2 and 1, depending on the desired percentage of radiation to be transmitted by the pellicle membrane 232. For instance, the pellicle membrane 232 has greater than 95% of EUV light transmittance.

Figure 2C:
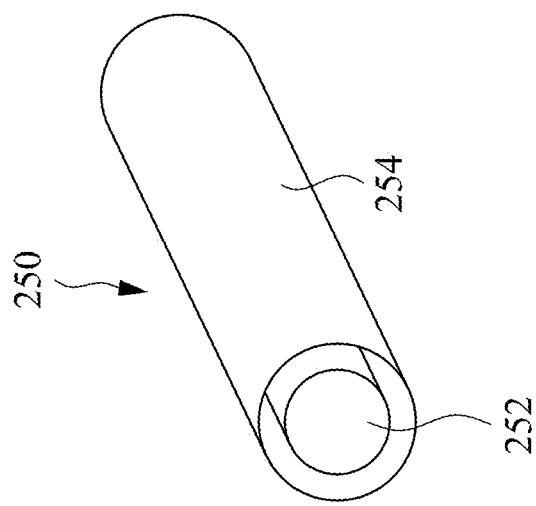
FIG. 2C illustrates a perspective view of a heterostructure nanotube of the network of heterostructure nanotubes illustrated in FIG. 2B.
Figure 2B:
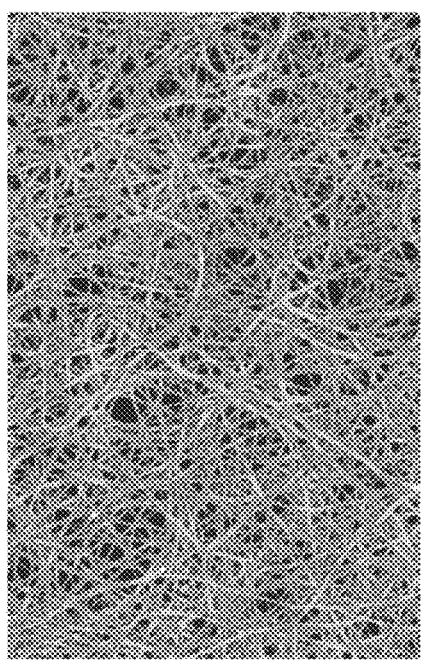
FIG. 2B illustrates a pellicle membrane of FIG. 2A, in accordance with some embodiments.

FIG. 2C, for instance, illustrates a perspective view of a heterostructure nanotube 250 of the network of heterostructure nanotubes illustrated in FIG. 2B. As illustrated, the heterostructure nanotube 250 includes a CNT core 252 surrounded by a BNNT shell 254. In some embodiments, the CNT core 252 is formed of a single CNT and the BNNT shell 254 surrounding the single CNT. In some embodiments, the CNT core 252 is formed of a CNT bundle and the BNNT shell 254 surrounds the CNT bundle. A CNT bundle may include for instance 2 to 20 individual CNTs. In a CNT bundle, individual CNTs may be aligned and joined along their longitudinal directions. CNTs of a bundle may also be joined end-to-end such that the length of the CNT bundle is greater than the length of the individual CNTs. The CNTs may typically be joined by van der Waals forces. In some embodiments, the CNT core 252 is formed of a CNT aggregate and the BNNT shell 254 surrounds the CNT aggregate. A CNT aggregate may include more than 10 individual CNTs joined both side-by-side and end-to-end, accordingly, both the length and diameters of the CNT aggregate are greater than the length and diameter of the individual CNTs, respectively. The BNNT shell 254 has excellent mechanical strength while maintaining high transmittance to EUV radiation. As a result, the stability of the CNTs is improved.

The CNT core 252 may be formed from a single- or double-wall nanotube or a multi-walled carbon nanotube. Single-walled CNTs can have many different diameters, such as from about 0.1 nm to 10 nm. Multi-walled CNTs have multiple graphitic layers arranged generally concentrically about a common axis. Diameters of multi-walled CNTs can range from about 3 nm to about 100 nm. Single- or multi-walled CNTs may have a wide variety of lengths. For example, single- or multi-walled CNTs may have a length from about 10 nm to about 1 from about 20 nm to about 500 nm, or from about 50 nm to about 100 nm. In some embodiments, single- or multi-walled CNTs may have an aspect ratio (i.e., a ratio of the length of the CNT to the diameter of the CNT) of about 100:1 to 1000:1.

The BNNT shell 254 may be a single- or multi-walled boron nitride nanotube including 1 to 40 layers of boron nitride. The total thickness of the BNNT shell 254 is controlled so that the BNNT shell 254 does not degrade the transparency of the pellicle membrane 232 to EUV radiation while providing a reliable protection to the CNT core 252. In some embodiments, the total thickness of the BNNT shell 254 may range from about 1 nm to about 20 nm. If the thickness of the BNNT shell 254 is too small, protection to the CNT core 252 from attacking by UV or EUV radiation or chemicals such as hydrogen ion, hydrogen radical or oxygen is not sufficient, in some instances. If the thickness of the BNNT shell 254 is too great, the transparency of the pellicle membrane is degraded, in some instances. In some embodiments, the BNNT shell 254 has a thickness of 5 nm.

Figure 3:
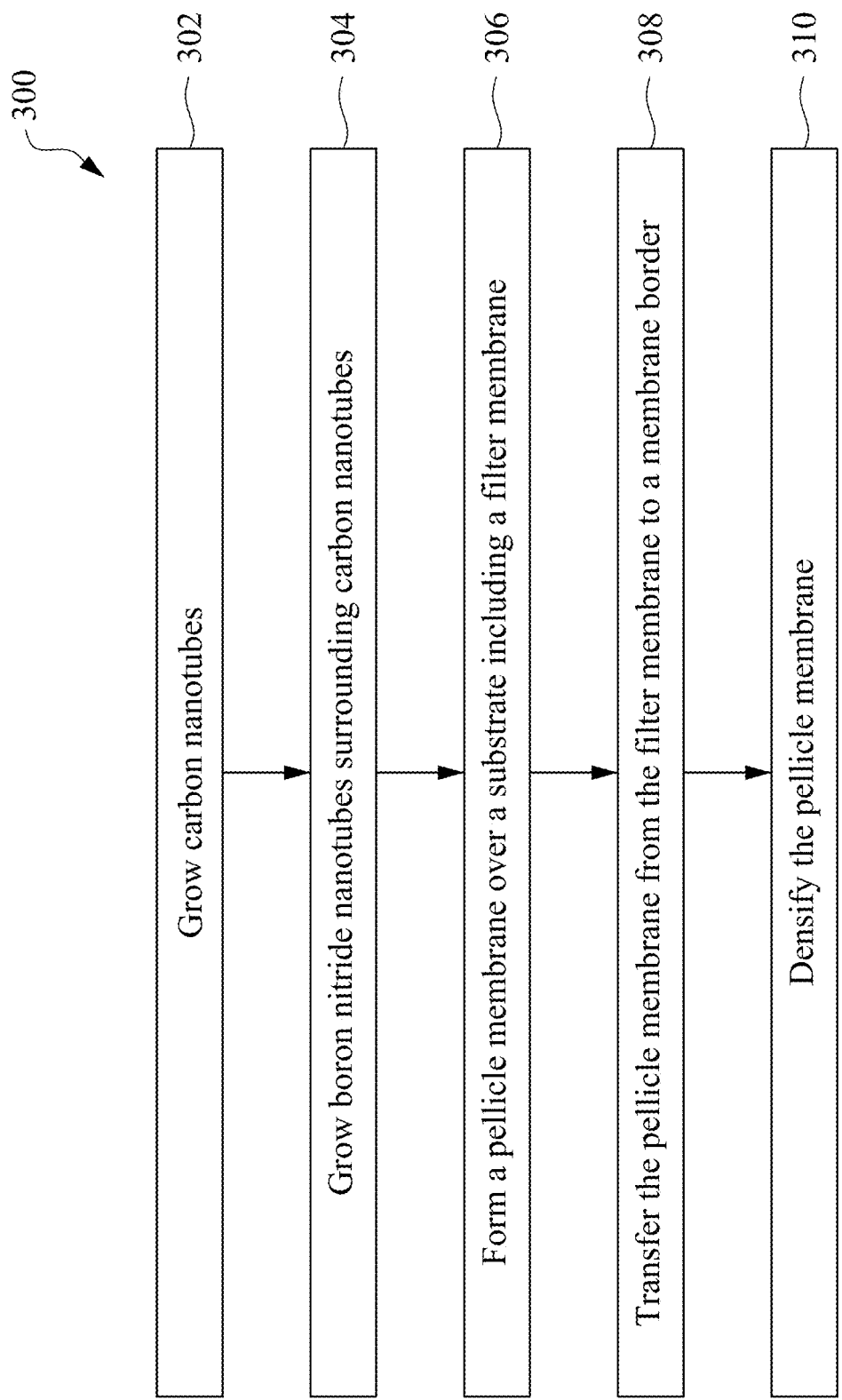
FIG. 3 is a flowchart of a method for fabricating a pellicle membrane assembly, in accordance with some embodiments.

FIG. 3 is a flowchart of a method 300 for fabricating a pellicle membrane assembly 230 using a reactor 410, in accordance with some embodiments of the present disclosure. FIGS. 4A-4E illustrate the pellicle membrane assembly 230 at various stages of the method 300. It is understood that additional steps can be provided before, during, and after the method 300, and some of the steps described below can be replaced or eliminated, for additional embodiments of the method. It is further understood that additional features can be added in the pellicle membrane assembly, and some of the features described below can be replaced or eliminated, for additional embodiments of the pellicle membrane assembly.

Figure 4A:
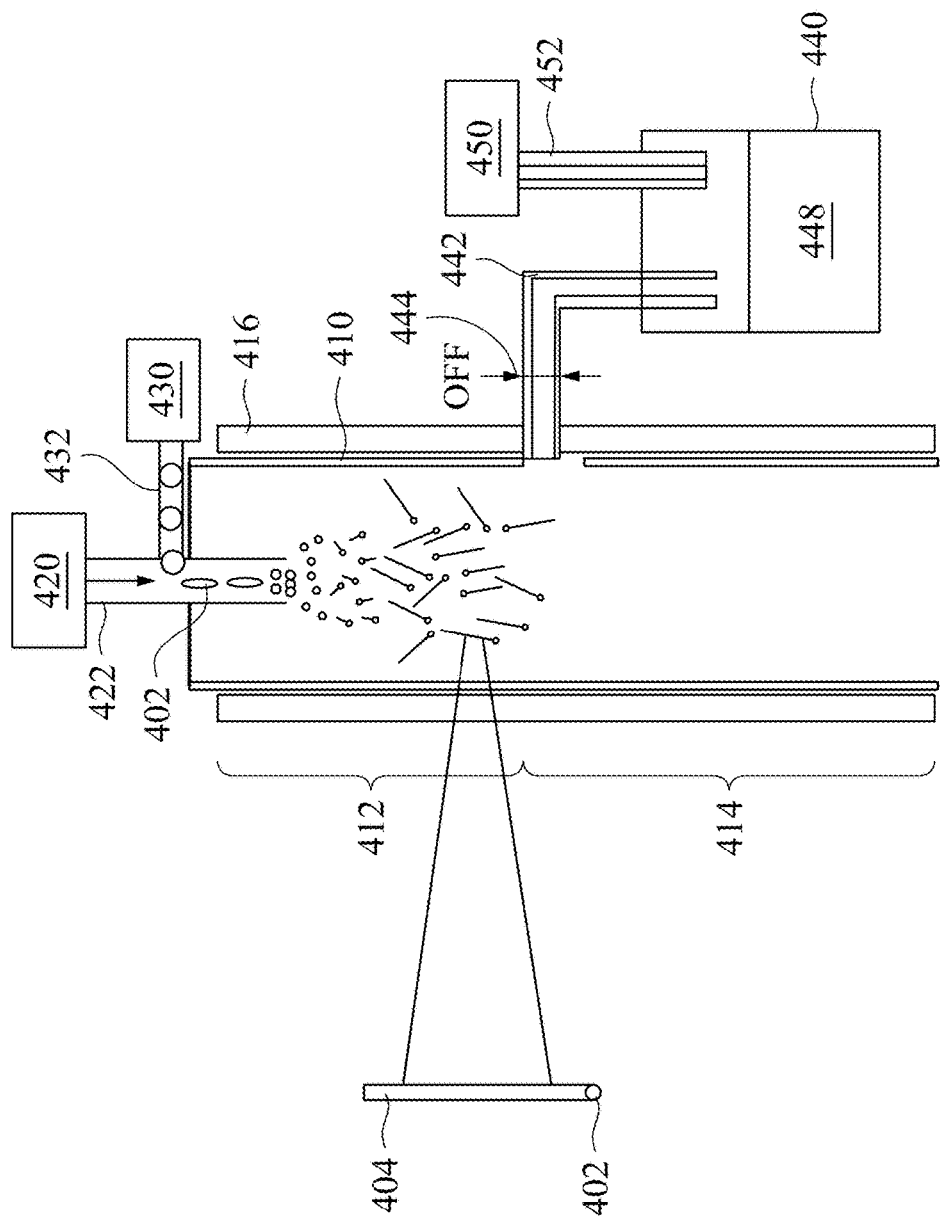
FIGS. 4A-4E illustrate the pellicle membrane assembly at various stages of the method of FIG. 3.

Referring to FIGS. 3 and 4A, the method 300 includes operation 302, in which CNTs 404 are formed in a first reaction zone 412 of a reactor 410, in accordance with some embodiments. The reactor 410 is configured to form the CNT core 252 and the BNNT shell 254 that constitute the heterostructure nanotubes 250 in a continuous process. FIG. 4A is a schematic view of the reactor 410 illustrating growth of CNTs 404 in the first reaction zone 412 of the reactor 410 by a gas-phase flow method, in accordance with some embodiments.

In operation 302, CNTs 404 are synthesized, for example, by a catalytic chemical vapor deposition (CVD) process in which pyrolysis of a carbon source occurs on in-situ formed metal catalyst particles 402. As illustrated in FIG. 4A, the reactor 410 includes a first reaction zone 412 and a second reaction zone 414 situated downstream from the first reaction zone 412. CNTs 404 are synthesized in the first reaction zone 412, while BNNTs 406 (FIG. 4B) are grown wrapping around the CNTs 404 in the second reaction zone 414. In some embodiments, the first reaction zone 412 has a length greater than 5 m. In some embodiments, the reactor 410 includes a quartz tube which is mounted vertically inside a heating element 416 adapted for heating the reactor 410. In some embodiments, the heating element 416 is a two-zone heating element configured to heat the reactor 410 to maintain a first temperature in the first reaction zone 412 and a second temperature in the second reaction zone 414 of the reactor 410. In some embodiments, the heating element 416 is configured to maintain a temperature gradient from about 500° C. to about 1100° C. in the first reaction zone 412 and maintain a temperature ranging from about 1000° C. to about 1100° C. in the second reaction zone 414 of the reactor 410.

A first gas supply unit 420 is fluidly connected to the first reaction zone 412 of the reactor 410 via a first gas inlet 422. The first gas supply unit 420 is configured to supply a carrier gas including an inert gas such as argon (Ar) gas and/or a reactive gas such as hydrogen ($H_2$) gas into the reactor 410. The first gas inlet 422 may include a spray nozzle for injecting the reaction mixture.

A first source material supply unit 430 is fluidly connected to the first reaction zone 412 of the reactor 410 via a first reactant inlet 432. The first source material supply unit 430 is configured to supply a feedstock for growing CNTs 404 to the first reaction zone 412. In some embodiments, the first reactant inlet 432 is connected to a side of the first gas inlet 422. The injection direction thus is in a direction perpendicular to the flow direction of the carrier gas.

A second source material supply unit 440 is fluidly connected to the second reaction zone 414 of the reactor 410 via a second reactant inlet 442. The second source material supply unit 440 is configured to supply a boron nitride source for growing boron nitride nanotubes to the second reaction zone 414 of the reactor 410. A shut-off valve 444 is coupled to the second reactant inlet 442 and is used to automatically shut off the flow of a vaporized boron nitride source into the reactor 410.

A second gas supply unit 450 is fluidly connected to the second source material supply unit 440 via a second gas inlet 452. The second gas supply unit 450 is configured to supply a carrier gas to the second source material supply unit 440 for carrying the vaporized boron nitride source into the second reaction zone 414 of the reactor 410.

In the CVD process, a feedstock comprising raw materials for growing CNTs is supplied from the first source material supply unit 430 to the first reaction zone 412 of the reactor 410 via the first reactant inlet 432. In some embodiments, the feedstock includes a carbon source. Examples of carbon sources may include, but are not limited to, gaseous carbon sources such as methane, ethane, propane, ethylene, acetylene as well as liquid volatile carbon sources such as benzene, toluene, xylene, trimethylbenzene, methanol, ethanol, and/or octanol. Alternatively, carbon monoxide gas or carbon dioxide gas can be used as a carbon source.

The feedstock further includes a catalyst precursor from which the metal catalyst particles 402 can be generated for subsequent growth of CNTs 404. Examples of catalyst precursors may include, but are not limited to, transition metals such as tungsten, molybdenum, chromium, iron, nickel, cobalt, rhodium, ruthenium, palladium, osmium, iridium, or platinum, and organometallic complexes such as ferrocene, cobaltocene, nickelocene, iron carbonyl, iron acetylacetonate, or iron oleate. The feedstock may include the catalyst precursor in an amount of 0.5 to 5 wt. %, 1 to 5 wt. %, or 1.5 to 4 wt. % based on the amount of the carbon source. If an excess amount of the catalyst precursor is used relative to the amount of the carbon source, the catalyst may act as an impurity, making it difficult to obtain highly pure CNTs.

In some embodiments, the feedstock may further include a catalyst promoter. The catalyst promoter contains sulfur atoms which interact with metal catalyst particles 402, thereby promoting formation of single-walled CNTs. Examples of a catalyst promoter may include, but are not limited to, thiophene, thianaphthene, benzothiophene, and hydrogen sulfide. The feedstock may include the catalyst promoter in an amount of 0.5 to 5 wt. %, 1 to 5 wt. %, or 1.5 to 4 wt. % based on the amount of the carbon source. If an excess amount of the catalyst promoter is used relative to the amount of the carbon source, the catalyst promoter may act as an impurity, making it difficult to obtain highly pure CNTs.

In some embodiments, the feedstock includes methane as the carbon source, ferrocence as the catalyst precursor, and thiophene as the catalyst promoter.

The feedstock may be transported into the reactor 410 by a carrier gas to ensure a rapid homogeneous reaction. In some embodiments, the carrier gas may include an inert gas such as argon (Ar) or helium (He) gas and/or a reactive gas such as hydrogen ($H_2$) gas. In some embodiments, a ratio of the carbon source to the carrier gas, which is a volume ratio of the carbon source to the carrier gas, at room temperature is from $5.0 \times 10^{-8}$ to $1.0 \times 10^{-4}$ v/v or from $1.0 \times 10^{-7}$ to $1.0 \times 10^{-5}$ v/v. In some embodiments, the carbon source is introduced into the reactor 410 at a flow rate ranging from 4 standard cubic centimeters per minute (sccm) to 120 sccm.

In some embodiments, the feedstock may be preheated prior to, or in combination with its introduction into the first reaction zone 412 of the reactor 410 to vaporize the reactants in the feedstock. In some embodiments, before entering the first reaction zone 412 of the reactor 410, the feedstock is maintained at a temperature below the decomposition temperature of the catalyst precursor. If the temperature exceeds the decomposition temperature of the catalyst precursor, catalyst clusters may form too early in the process and become inactivated before they can participate in the CNT growth process. In some embodiments, the feedstock is maintained at a temperature from 70° C. to 200° C.

The reactor 410 is heated to produce a temperature gradient in the first reaction zone 412. In some embodiments, the temperature gradient is produced from about 500° C. to about 1100° C. with a temperature increase along the length of the first reaction zone 412. In some embodiments, the length of the first reaction zone 412 is greater than 5 meter. Thus, once the feedstock is injected into the first reaction zone 412 of the reactor 410 via the first gas inlet 422, the catalyst precursor decomposes to form metal catalyst particles 402. In some embodiments, the metal catalyst particles 402 may be formed to have a dimeter ranging from about 0.5 nm to about 5 nm. As the carbon source comes in contact with the metal catalyst particles 402 in the first reaction zone 412, the carbon source is decomposed at high temperatures (e.g., at about 700° C. or greater) on metal catalyst particles 402 and the CNTs 404 are grown from the metal catalyst particles 402 in such a way that a metal catalyst particle 402 is embedded in the growth tip of a CNT 404. The diameter of the CNTs 404 is thus determined by the size of the metal catalyst particles 402. Each of CNTs 404 formed may include a single CNT or a CNT bundle including, for example, 2 to 20 individual CNTs.

Figure 4B:
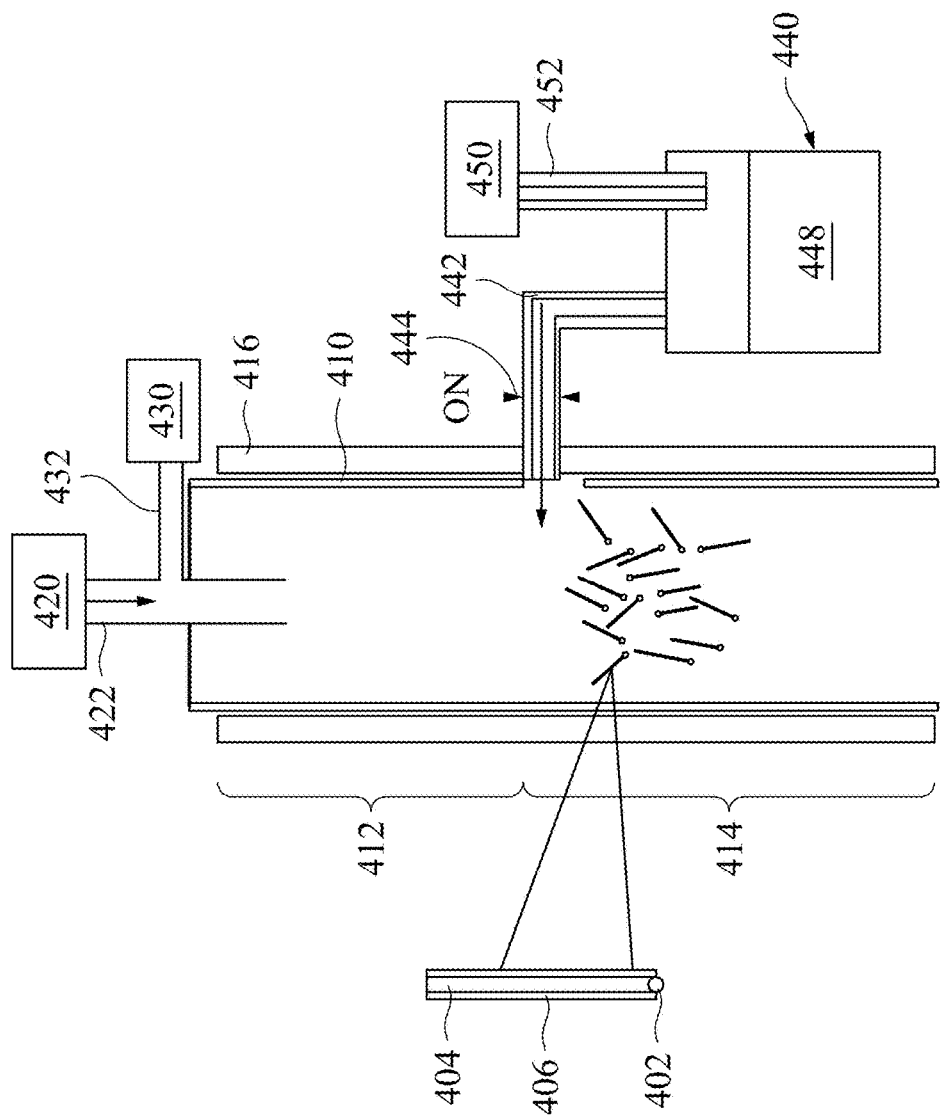

Referring to FIGS. 3 and 4B, the method 300 proceeds to operation 304, in which BNNTs 406 are formed to surround CNTs 404 in the second reaction zone 414 of the reactor 410, in accordance with some embodiments. FIG. 4B is a schematic view of the reactor 410 illustrating growth of the BNNTs 406 surrounding the CNTs 404 in the second reaction zone 414 of the reactor 410, in accordance with some embodiments.

As illustrated in FIG. 4B, the BNNTs 406 may be formed by first providing a boron nitride source 448 in the second source material supply unit 440. In some embodiments, the boron nitride source 448 may include an amine borane complex such as aminoborane ($H_2B=NH_2$), ammonia borane ($H_3N-BH_3$), borazine ($B_3N_3H_3$), or combinations thereof.

The second source material supply unit 440 may then be heated to a temperature at which the boron nitride source 448 is sublimed. Temperature at which the sublimation is carried out may be varied depending on the type of the boron nitride source 448 used. In some embodiments, sublimation of the boron nitride source 448 is carried out at a temperature greater than about 50° C. and less than about 100° C. In some embodiments, sublimation of the boron nitride source 448 is carried out at a temperature ranging from 70° C. to 90° C., such as about 70° C., about 75° C., about 80° C., about 85° C., or about 90° C. In some embodiments and when the boron nitride source 448 is ammonia borane, the sublimation of ammonia borane is carried out at about 80° C.

Next, the vaporized boron nitride source may be mixed with a carrier gas that is flowed into the second source material supply unit 440 via the second gas inlet 452. In some embodiments, the carrier gas is an inert gas such as argon. The carrier gas may be flowed into the second source material supply unit 440 at a flow rate ranging from about 5 sccm to about 15 sccm.

As the CNTs 404 enter into the second reaction zone 414 of the reactor 410, the shut-off valve 444 is opened to allow the vaporized boron nitride source 448 that is carried by the carrier gas flow into the second reaction zone 414 of the reactor 410 via the second reactant inlet 442. The second reaction zone 414 is maintained at a temperature sufficiently high to promote the growth of BNNTs 406 on the CNTs 404, but not so high to adversely impact physical and chemical properties of the CNTs 404. The temperature of the second reaction zone 414 is also sufficiently high to remove the metal catalyst particles 402 at the tips of the CNTs 404. In some embodiments, the temperature in the second reaction zone is maintained from about 1000° C. to about 1100° C.

At the second reaction zone 414, the vaporized boron nitride source contacts the CNTs 404 and decomposes at the second reaction zone temperature to form boron nitride. The boron nitride is conformally deposited on surfaces of the CNTs 404 so as to assume the morphological structure of the CNTs 404, thereby forming BNNTs 406 surrounding CNTs 404.

The growth of the BNNTs 406 may be performed under an inert atmosphere and/or a reducing atmosphere. The inert atmosphere may be created using an inert gas such as argon or helium. The reducing atmosphere may be created using hydrogen gas. When the inert gas and hydrogen gas are used as a mixture, an amount of the inert gas may be from about 90% to about 97% by volume, and an amount of the hydrogen gas may be from about 3% to about 10% by volume. The inert gas may be supplied, for example, at a flow rate from about 100 sccm to about 500 sccm, and the hydrogen gas may be supplied, for example at a flow rate from about 5 sccm to about 30 sccm. In some embodiments, an argon and hydrogen mixed gas containing 3% of hydrogen gas is supplied into the reactor 410 via the first gas inlet 422.

The resulting BNNTs 406 may include any number of layers of boron nitride, for example, from a single layer to about 100 layers. For example, in some embodiments, the BNNTs 406 may include from one layer to about 20 layers of boron nitride.

Accordingly, a plurality of heterostructure nanotubes 250 is thus formed. Each of the heterostructure nanotubes 250 includes a CNT 404 as the core (i.e., CNT core 252) and a BNNT 406 as the shell (i.e., BNNT shell 254). As noted above, the CNT 404 may be a single CNT or a CNT bundle including 2 to 20 individual CNTs.

The high temperature (i.e., temperature from 1000° C. to about 1100° C.) used for growing BNNTs 406 causes evaporation of the metal catalyst nanoparticles 402 at the tips of the CNTs 404, which in turn results in removal of the metal catalyst from the heterostructure nanotubes 250. Thus, after exiting the reactor 410, the heterostructure nanotubes 250 contain less than 0.01 atomic % of catalyst metal. In some embodiments, the catalyst metal is completely removed so that the heterostructure nanotubes 250 are free of catalyst metal. Since catalyst metal has a higher absorption coefficient in the EUV wavelengths than the carbon and boron nitride, simultaneous removal of the catalyst metal during the growth of BNNTs 406 helps to improve the EUV transmission of the pellicle membrane 232.

Figure 4C:
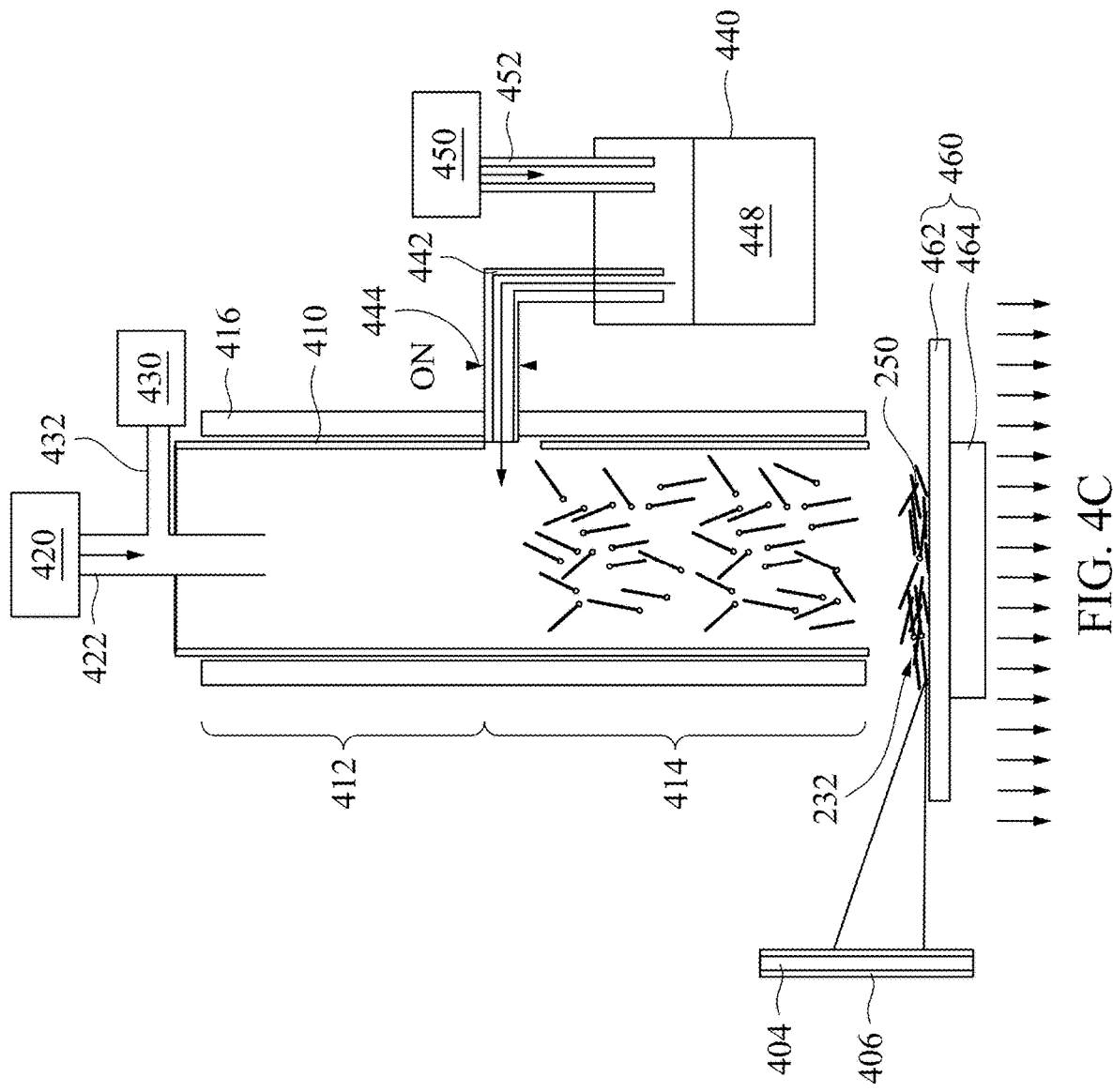

Referring to FIGS. 3 and 4C, the method 300 proceeds to operation 306, in which a pellicle membrane 232 is formed over a substrate 460, in accordance with some embodiments. FIG. 4C is a schematic view of the reactor 410 illustrating the heterostructure nanotubes 250 exiting the reactor 410, thereby forming the pellicle membrane 232 over the substrate 460, in accordance with some embodiments.

As illustrated in FIG. 4C, a cooling process may be performed on the heterostructure nanotube 250. The cooling process may be performed, for example, at a rate from about 10° C. to about 100° C. per minute, or from about 20° C. to about 80° C. per minute. During the cooling process, an inert gas such as argon may be supplied to the reactor 410 via the first gas inlet 422 to prevent the oxidation of the heterostructure nanotubes 250. In some embodiments, the argon gas may be flowed into the reactor 410 at a flow rate from about 100 sccm to about 800 sccm. The cooling process may be a natural cooling process, which may be implemented by stopping operation of a heating element 416 or by removing the heating element 416 away from the reactor 410.

The heterostructure nanotubes 250 are collected at the bottom of the reactor 410 by substrate 460. In some embodiments, the substrate 460 may include a filter membrane 462. In some embodiments, the filter membrane 462 is a porous membrane having pores between about 0.1 μm to about 5 μm in diameter. In one example, the pore size in the filter membrane 462 is from about 0.1 μm to about 0.6 μm. In another example, the pore size is about 0.45 μm. In some embodiments, the filter membrane 462 is formed of or coated with polyethylene terephthalate (PET). In some embodiments, the filter membrane 462 is formed of or coated with other suitable materials such as nylon, cellulous, polymethylmethacrylate (PMMA), polystyrene (PS), polytetrafluoroethylene (PTFE), or polybenzoxazole (PBO). In some embodiments, the filter membrane 462 is formed of a cellulose-based filter paper. In some embodiments, the filter membrane 462 is a hydrophilic membrane. In some other embodiments, the filter membrane 462 is a hydrophobic membrane.

In some embodiments, to prevent the penetration of the heterostructure nanotubes 250 through the pores of the filter membrane 462, the substrate 460 may further include a support 464 over which the filter membrane 462 is placed. The support 464 may be formed of any suitable material, such as glass or quartz. In some embodiments, the support 464 is formed of a quartz substrate.

A vacuum suction process may be applied to the substrate 460 to facilitate the uniform dispersion of the heterostructure nanotubes 250 on the filter membrane 462. One or more layers of uniformly distributed heterostructure nanotubes is thus formed on the filter membrane 462 to provide a pellicle membrane 232. The pellicle membrane may include, for example, one, two, three, four, or more heterostructure nanotube layers. Each heterostructure nanotube layer may include a random web of heterostructure nanotubes 250.

In some embodiments, after formation of the pellicle membrane 232, the support 464 may be subsequently removed from the structure.

Figure 4D:
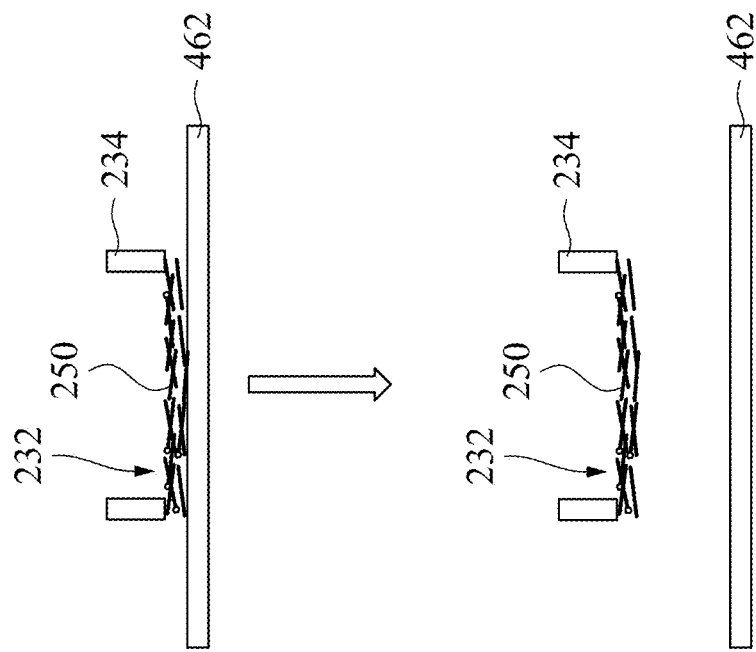

Referring to FIGS. 3 and 4D, the method 300 proceeds to operation 308, in which the pellicle membrane 232 is transferred from the filter membrane 462 to a membrane border 234, in accordance with some embodiments. FIG. 4D is a schematic illustration of transferring the pellicle membrane 232 from the filter membrane 462 to the membrane border 234, in accordance with some embodiments.

As illustrated in FIG. 4D, the transfer of the pellicle membrane 232 is carried out by first attaching the membrane border 234 along a peripheral portion of the pellicle membrane 232. In some embodiments, the membrane border 234 is made of silicon. To attach the membrane border 234 to the pellicle membrane 232, in some embodiments, the membrane border 234 is first brought into physical contact with the pellicle membrane 232. The membrane border 234 is then pressed against the pellicle membrane 232 to fix the membrane border 234 to the pellicle membrane 232, given that a sufficient force is used. In some embodiments, the membrane border 234 and the pellicle membrane 232 are held together by van der Waals forces. In some embodiments, before attaching the membrane border 234 to the pellicle membrane 232, the membrane border 234 is pre-wetted by a polar solvent such as ethanol. The ethanol helps to improve the adhesion between the membrane border 234 and the pellicle membrane 232 so as to provide a stable contact therebetween.

Subsequently, the filter membrane 462 is removed from the pellicle membrane 232. In some embodiments, the filter membrane 462 may be removed by peeling or pulling the filter membrane 462 away from the pellicle membrane 232. As shown in FIG. 4D, after removal of the filter membrane 462, the pellicle membrane 232 is supported by the membrane border 234 along the peripheral portion of the pellicle membrane 232.

In some embodiments, and when ethanol is employed to improve the adhesion between the pellicle membrane 232 and the membrane border 234, after removing the filter membrane 462, the assembly, including the pellicle membrane 232 and the membrane border 234, is dried in air or under vacuum for a period of time to allow the ethanol to evaporate.

Figure 4E:
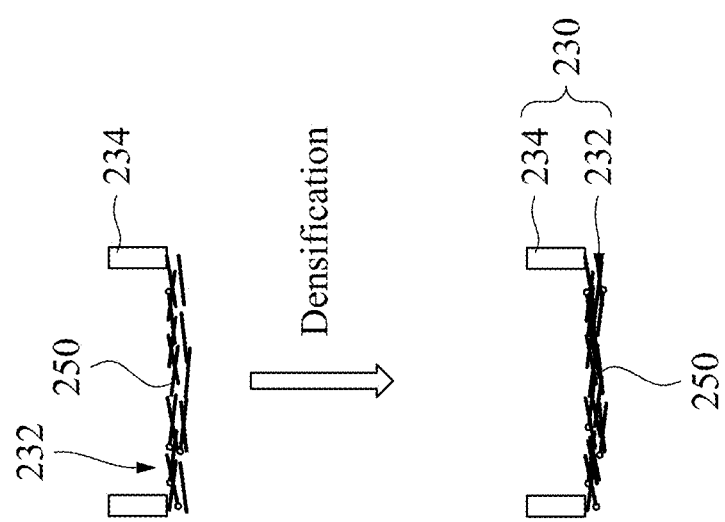

Referring to FIGS. 3 and 4E, the method 300 proceeds to operation 310, in which the pellicle membrane 232 is densified, in accordance with some embodiments. FIG. 4E is a schematic illustration of densifying the pellicle membrane 232, in accordance with some embodiments.

As illustrated in FIG. 4E, the heterostructure nanotubes 250 in the pellicle membrane 232 are densified into large bundles of aligned heterostructure nanotubes held together by van der Waals forces. The densification may be performed by first treating the pellicle membrane 232 with an organic solvent. The organic solvent is a volatile solvent such as, ethanol, methanol, acetone, dicloroethane, chloroform, or combination thereof. In some embodiments, the pellicle membrane 232 is treated by exposing the pellicle membrane 232 to ethanol vapor. After being contacted with the organic solvent, the heterostructure nanotubes 250 in the pellicle membrane 232 are compacted into heterostructure nanotube bundles. The dense heterostructure nanotube structure increases the density of the pellicle membrane 232, which helps to minimize passage of particles through the pellicle membrane 232. The dense heterostructure nanotube structure also helps to improve contact between the pellicle membrane 232 and the membrane border 234. After densification, the pellicle membrane 232 is then dried under vacuum or in air.

The pellicle membrane 232 thus formed, includes a network of densified heterostructure nanotubes 250. The individual heterostructure nanotubes 250 are arranged randomly in the pellicle membrane 232 so that the heterostructure nanotubes 250 are not arranged along a major or predominant direction. The pellicle membrane 232 may have a thickness ranging from about 50 nm to about 100 nm. The thickness of the pellicle membrane 232 may be greater depending on the porosity of the pellicle membrane 232.

Figure 5:
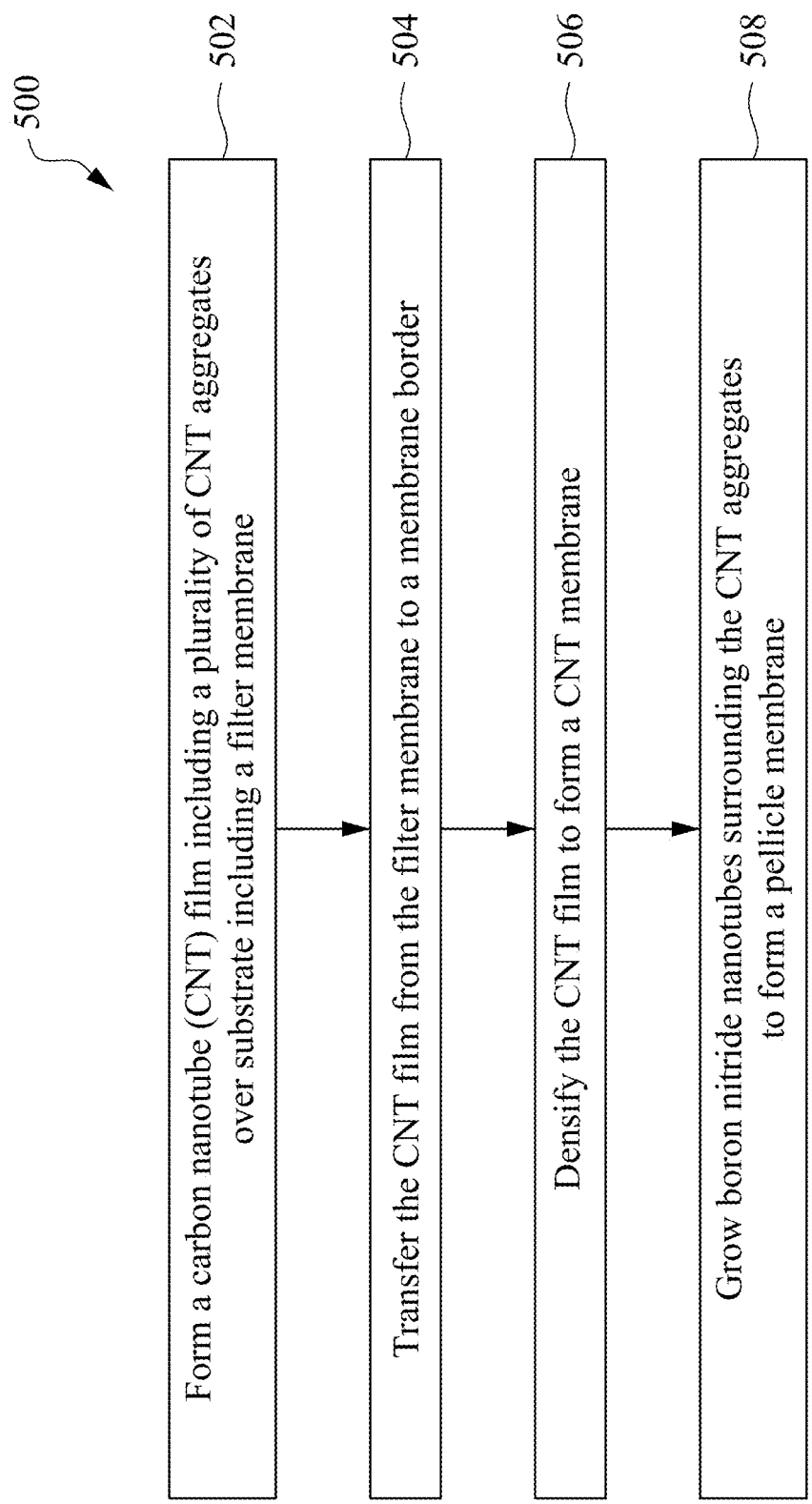
FIG. 5 is a flowchart of a method for fabricating a pellicle membrane assembly, in accordance with alternative embodiments.

FIG. 5 is a flowchart of a method 500 for fabricating a pellicle membrane assembly 230, in accordance with some alternative embodiments of the present disclosure. FIGS. 6A-6D illustrate the pellicle membrane assembly 230 at various stages of the method 500. It is understood that additional steps can be provided before, during, and after the method 500, and some of the steps described below can be replaced or eliminated, for additional embodiments of the method. Unless specified otherwise, components in FIGS. 6A-6D that are the same or similar to the components in FIGS. 4A-4E are given the same references numbers, and detailed description thereof is thus omitted.

Figure 6A:
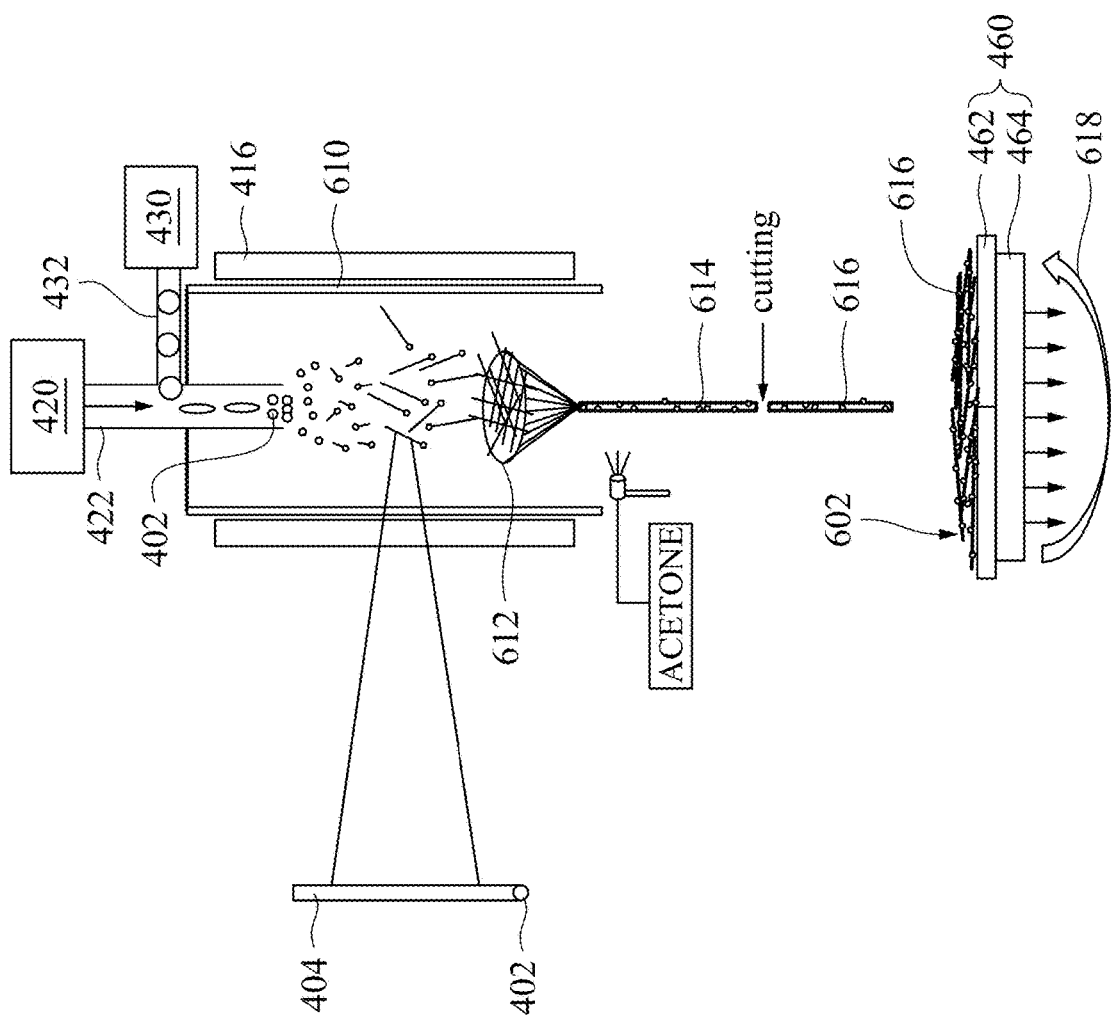
FIGS. 6A-6D illustrate the pellicle membrane assembly at various stages of the method of FIG. 5.

Referring to FIGS. 5 and 6A, the method 500 includes operation 502, in which a CNT film 602 is formed over a substrate 460, in accordance with some embodiments. FIG. 6A illustrates formation of the CNT film 602 over the substrate 460, in accordance with some embodiments.

The CNT film 602 includes a plurality of CNTs 404 in aggregated form (also referred to as CNT aggregates 616). In some embodiments, the CNT film 602 is formed by a direct spinning process based on a floating catalyst CVD using an apparatus 600. The floating catalyst CVD process is described above in FIG. 2A, and detailed description thereof is thus omitted. In some embodiments, the reactor 610 includes a vertical standing quartz tube enclosed by a heating element 416 for heating the reactor 610. A gas supply unit 420 is fluidly connected to the reactor 610 via a gas inlet 422 at the upper end of the reactor 610. A material source supply unit 430 is fluidly connected to the reactor 610 via a reactant inlet 432 coupled to a side of the gas inlet 422. Positioned within the reactor 610 is a nanotube catcher 612 configured to promote formation of CNT aggregates. In some embodiments, the nanotube catcher 612 is in the form of a ring of metal wire or a ring of glass wire.

When in use, the heating element 416 is heated to provide a temperature gradient from about 500° C. to about 1100° C. along the length of the reactor 610. In some embodiments, the length of the reactor 610 is greater than 5 m. A feedstock containing a carbon source, a catalyst precursor, and a catalyst promoter precursor carried by a carrier gas is injected into the reactor 610 via the gas inlet 422. In some embodiments, the CNT synthesis is carried out using toluene as the carbon source, ferrocene as the catalyst precursor, thiophene as the catalyst promoter, and hydrogen as the carrier gas. When the catalyst precursor contained in the feedstock is placed inside the reactor 610, the catalyst precursor is decomposed to form metal catalyst particles 402. CNTs 404 are then grown from the metal catalyst particles 402. In embodiments of FIG. 6A, the CNTs 404 are formed as aerogels. The aerogel-like CNTs 404 are collated by the nanotube catcher 612 and then spun in a direction normal to the gas flow direction while being pulled, for example, by a spinning shaft (not shown). The aerogel-like CNTs 404 are twisted together and a CNT fiber 614 begins to grow as the aerogel-like CNTs 404 move relative to the spinning shaft. Additional aerogel-like CNTs 404 may be twisted around the growing fiber to extend the length of the CNT fiber 614. The resulting CNT fiber 614 contains vertically aligned CNTs 404.

Next, the CNT fiber 614 may be densified by exposing the CNT fiber 614 with a densification agent. Suitable densification agents may include acetone and alcohols such as ethanol or isopropyl alcohol (IPA). In some embodiments, the densification may be carried out by spraying acetone to the CNT fiber 614.

The CNT fiber 614 may then be cut into pieces. Each piece includes CNT aggregates 616 with CNTs 404 joined side-by-side and end-to-end. In some embodiments, a CNT aggregate 616 may contain more than 10 of single CNTs 404. The CNT fiber pieces may be any suitable length. In some embodiments, the CNT fiber pieces may independently have a length ranging from 100 μm to 100 mm.

The CNT aggregates 616 are collected by a substrate 460 placed adjacent to the exit of the reactor 610. In some embodiments, the substrate 460 includes a filter membrane 462 over a support 464. In some embodiments, the substrate 460 may be rotated along the arrow direction 618. A vacuum suction process may also be applied to the substrate 460. The substrate rotation and vacuum suction are performed to facilitate uniform distribution of the CNT aggregates 616 on the filter membrane 462. The support 464 is subsequently removed after formation of the CNT film 602. The CNT film 602 thus formed includes a random web of CNT aggregates 616.

Figure 9:
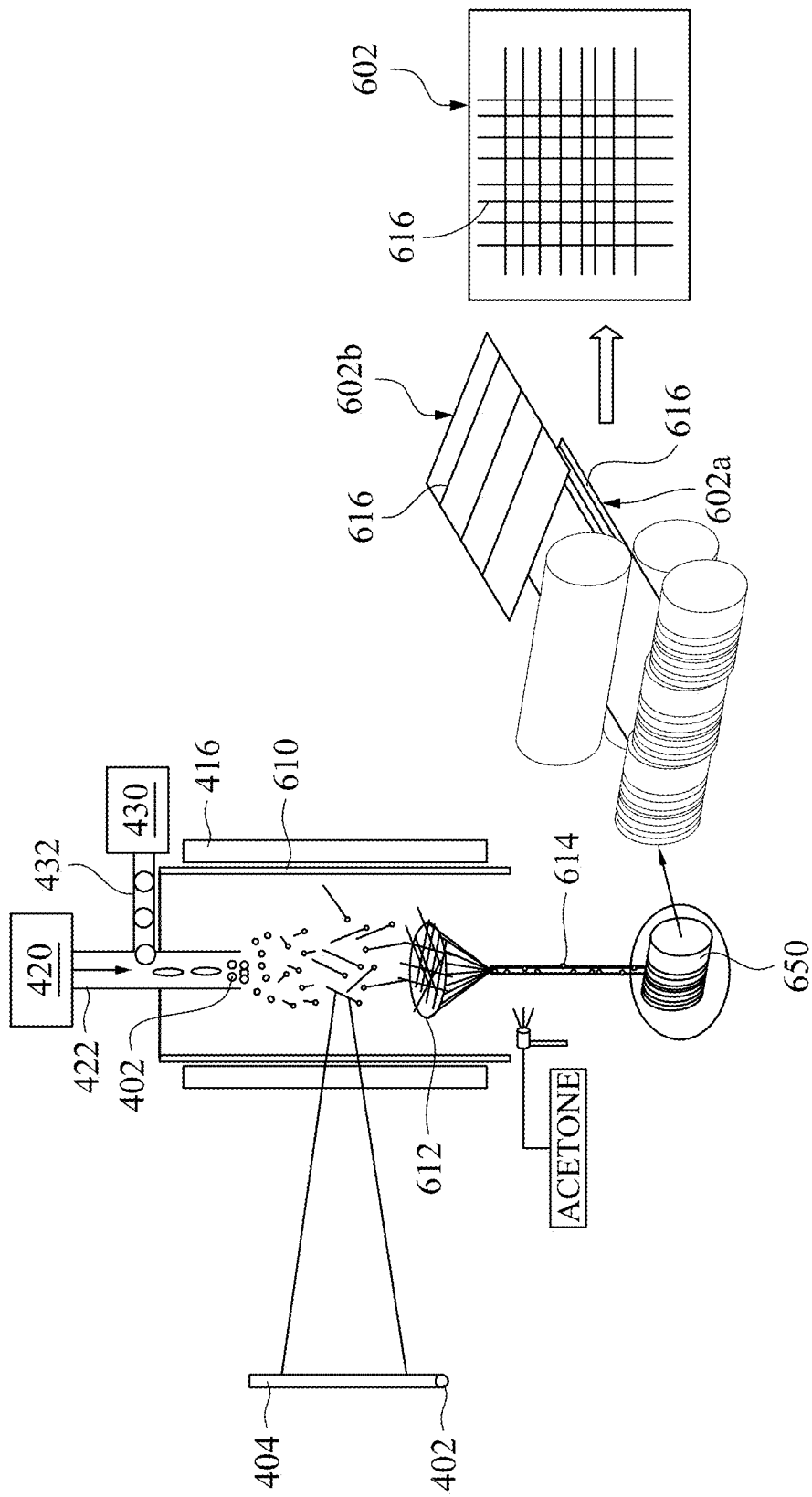
FIG. 9 illustrate a CNT film including interlaced CNT bundles, in accordance with some embodiments.

In some embodiments and as shown in FIG. 9, a roller 650 may be provided downstream of the reactor 610, so that the CNT fiber 614 may be collected and wound around the roller 650. In some embodiments, winding is performed at a rate ranging from about 5 rpm to about 100 rpm.

Subsequently, a CNT film 602 including interlaced CNT aggregates 616 is formed from the CNT fiber 614 so that the CNT aggregates 616 in a first CNT layer 602a are aligned in a first direction and the CNT aggregates 616 in a second CNT layer 602b adjacent to the first CNT layer 602a are aligned in a second direction different from the first direction. The interlaced CNT aggregates 616 thus creates a CNT film 602 having a regular web or grid structure. The interlacing of CNT aggregates 616 helps to improve the structural integrity of the CNT film 602. The CNT aggregates 616 in the CNT film 602 are subsequently densified by annealing at a temperature ranging from 1000° C. to 2000° C.

Figure 6B:
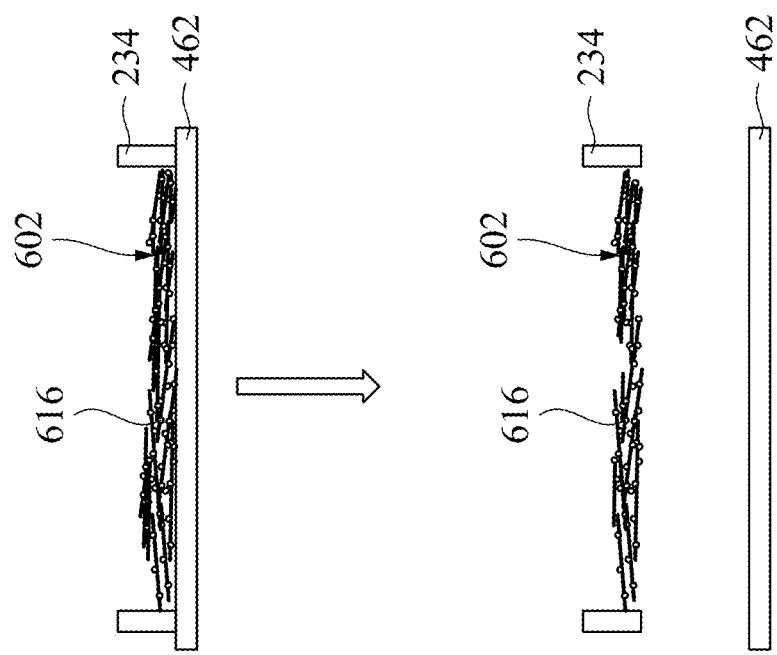

Referring to FIGS. 5 and 6B, the method 500 proceeds to operation 504, in which the CNT film 602 is transferred from the filter membrane 462 to a membrane border 234, in accordance with some embodiments. FIG. 6B illustrates transfer of the CNT film 602 from the filter membrane 462 to the membrane border 234, in accordance with some embodiments.

As illustrated in FIG. 6B, the transfer of the CNT film 602 is carried out by first attaching the membrane border 234 along a peripheral portion of the CNT film 602. In some embodiments, the membrane border 234 is made of silicon. To attach the membrane border 234 to the CNT film 602, in some embodiments, the membrane border 234 is first brought into physical contact with the CNT film 602. The membrane border 234 is then pressed against the CNT film 602 to fix the membrane border 234 to the CNT film 602 given that a sufficient force is used. In some embodiments, the membrane border 234 and the CNT film 602 are held together by van der Waals forces. In some embodiments, before attaching the membrane border 234 to the CNT film 602, the membrane border 234 is pre-wetted by a polar solvent such as ethanol. The ethanol helps to improve the adhesion between the membrane border 234 and the CNT film 602 so as to provide a stable contact therebetween.

Subsequently, the filter membrane 462 is removed from the assembly of the CNT film 602 and the membrane border 234. In some embodiments, the filter membrane 462 may be removed by peeling or pulling the filter membrane 462 away from the CNT film 602. As shown in FIG. 6B, after removal of the filter membrane, the CNT film 602 is supported by the membrane border 234 along the peripheral portion of the CNT film 602.

After removing the filter membrane 462, the assembly of the pellicle membrane 232 and the membrane border 234 is placed in the ambient atmosphere for a period of time to allow the ethanol to evaporate.

In some embodiments, and when ethanol is employed to improve the adhesion between the CNT film 602 and the membrane border 234, after removing the filter membrane 462, the CNT film 602 and the membrane border 234 may be dried in air or under vacuum for a period of time to allow the ethanol to evaporate.

Figure 6C:
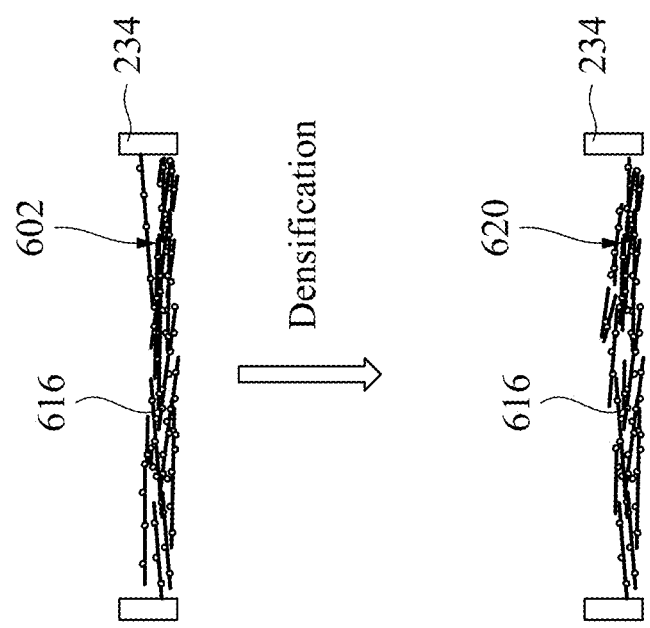

Referring to FIGS. 5 and 6C, the method 500 proceeds to operation 506, in which the CNT film 602 is densified to form a CNT membrane 620, in accordance with some embodiments. FIG. 6C illustrates densification of the CNT film 602 to form the CNT membrane 620, in accordance with some embodiments.

Referring to FIG. 6C, the CNT aggregates 616 in the CNT film 602 are densified to increase the density of the CNT film 602. The densification may be performed by first treating the CNT film 602 with an organic solvent. The organic solvent is a volatile solvent such as, ethanol, methanol, acetone, dicloroethane, chloroform, or combination thereof. In some embodiments, the CNT film 602 is treated by exposing the CNT film 602 to an ethanol vapor. After being soaked by the organic solvent, the CNT aggregates 616 in the CNT film 602 are compacted, thereby providing improved contact with the membrane border 234. The resulting CNT membrane 620 is then dried under vacuum or in air.

Figure 6D:
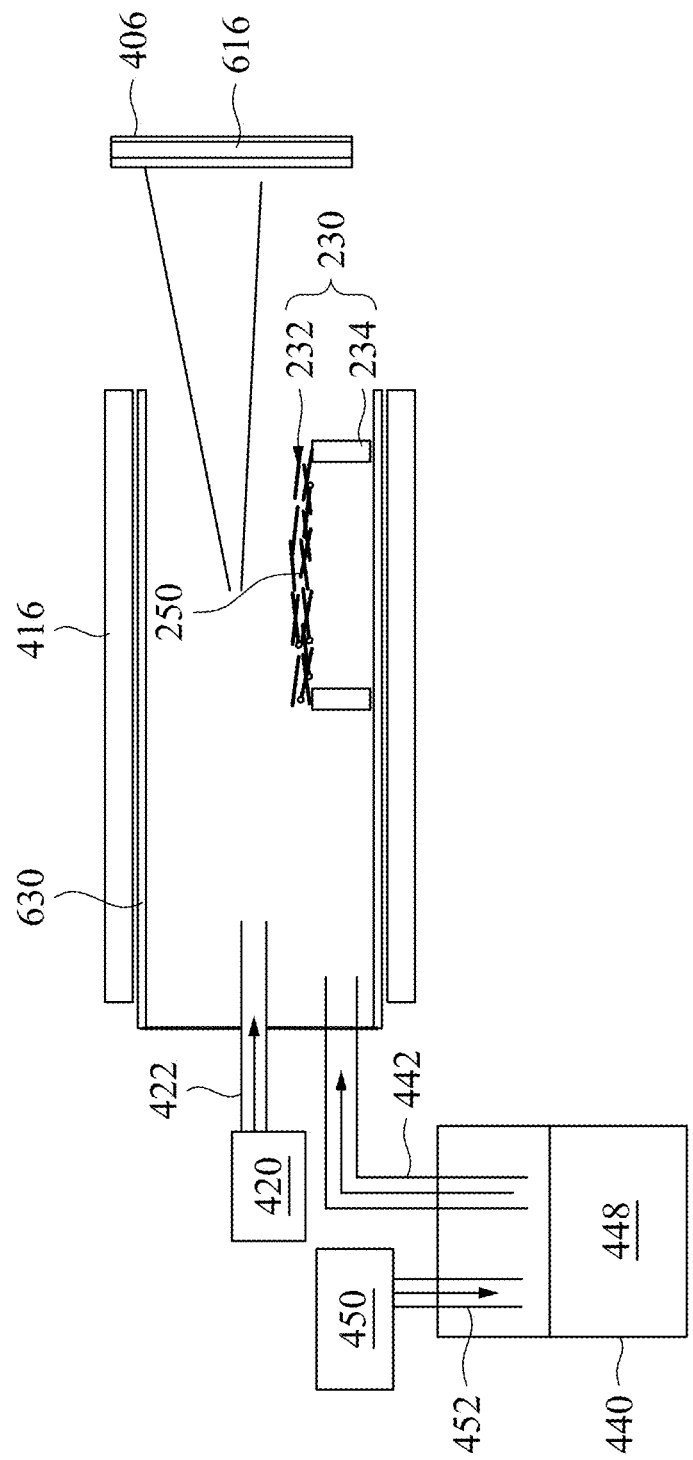

Referring to FIGS. 5 and 6D, the method 500 proceeds to operation 508, in which BNNTs 406 are formed surrounding CNT aggregates 616, in accordance with some embodiments. FIG. 6D illustrates formation of the BNNTs 406 surrounding CNT aggregates 616, in accordance with some embodiments.

As illustrated in FIG. 6D, the BNNTs 406 are formed by a low pressure thermal CVD process in which a vaporized boron nitride source undergoes pyrolysis when the vapor contacts the CNT aggregates 616 in a reactor 630. Pyrolysis results in the decomposition of the boron nitride source into boron nitride. The boron nitride thus are deposited on the CNT aggregates 616 as a shell (i.e., BNNT shell 254).

The reactor 630 includes a horizontal standing quartz tube enclosed by a heating element 416 for heating the reactor 630. A first gas supply unit 420 is fluidly connected to the reactor 630 via a first gas inlet 422 at one end of the reactor 630. A material source supply unit 440 that contains a boron nitride source 448 is fluidly connected to the reactor 630 via a reactant inlet 442. The source material supply unit 440 is configured to supply the boron nitride source for growing BNNTs to the reactor 630. A second gas supply unit 450 is fluidly connected to the source material supply unit 440 via a second gas inlet 452. The second gas supply unit 450 is configured to supply a carrier gas to the source material supply unit 440.

The assembly including the CNT membrane 620 and the membrane border 234 is placed inside the reactor 630. The temperature of the reactor 630 is then gradually increased to a temperature ranging from about 1000° C. to 1100° C. by heating the reactor 630 using the heating element 416.

The source material supply unit 440 is then heated to a temperature at which the boron nitride source 248 is sublimed. Temperature at which the sublimation is carried out may vary depending on the type of boron nitride source 448 used. In some embodiments, sublimation of the boron nitride source 448 is carried out at a temperature greater than about 50° C. and less than about 100° C. In some embodiments, sublimation of the boron nitride source 448 is carried out at a temperature ranging from 70° C. to 90° C., such as about 70° C., about 75° C., about 80° C., about 85° C., or about 90° C. In some embodiments, and when the boron nitride source is ammonia borane, the sublimation of ammonia borane is carried out at about 80° C.

Next, the vaporized boron nitride source is mixed with a carrier gas that is flowed into the source material supply unit 440 via the second gas inlet 452 from the second gas supply unit 450. In some embodiments, the carrier gas is an inert gas such as argon. The carrier gas may be flowed into the source material supply unit 440 at a flow rate ranging from about 5 sccm to about 15 sccm.

The vaporized boron nitride source that is carried by the carrier gas is then supplied into the reactor 630 via the reactant inlet 442. The vaporized boron nitride source contacts the CNT aggregates 616 and then decomposes to form boron nitride. The boron nitride is conformally deposited on surfaces of the CNT aggregates 616 so as to assume the morphological structure of the CNT aggregates 616, thereby forming BNNTs 406 surrounding the CNT aggregates 616.

The growth of the BNNTs 406 may be performed under an inert atmosphere and/or a reducing atmosphere. The inert atmosphere may be created using an inert gas such as argon or helium. The reducing atmosphere may be created using hydrogen gas. When the inert gas and hydrogen gas are used as a mixture, an amount of the inert gas may be from about 90% to about 97% by volume, and an amount of the hydrogen gas may be from about 3% to about 10% by volume. The inert gas may be supplied, for example, at a flow rate from about 100 sccm to about 500 sccm, and the hydrogen gas may be supplied, for example at a flow rate from about 5 sccm to about 30 sccm. In some embodiments, an argon and hydrogen mixed gas containing 3% of hydrogen gas is supplied into the reactor 630 via the first gas inlet 422 at a flow rate of 300 sccm. The growth of the BNNTs 406 is carried out at a low pressure ranging from about $10^{-3}$ Torr to about $10^{-2}$ Torr.

The resulting BNNTs 406 may include any number of layers of boron nitride, for example, from a single layer to about 100 layers of boron nitride. In some embodiments, the BNNTs 406 may include from a single layer to about 20 layers of boron nitride.

Accordingly, a plurality of heterostructure nanotubes 250 is thus formed. Each of the heterostructure nanotubes 250 includes a CNT aggregates 616 as the core (i.e., CNT core 252) and a BNNT 406 as the shell (i.e., BNNT shell 254).

The high temperature (i.e., temperature from 1000° C. to about 1100° C.) used for growing BNNT shell 254 causes the evaporation of metal catalyst particles 402 at the tips of the CNTs 404 contained in the CNT aggregates 616, and thus, results in the removal of the metal catalyst from the heterostructure nanotubes 250. Thus, after exiting the reactor 410, the heterostructure nanotubes 250 contain less than 0.01 atomic % of catalyst metal. In some embodiments, the catalyst metal is completely removed so that the heterostructure nanotubes 250 are free of catalyst metal. Since catalyst metal has a higher absorption coefficient in the EUV wavelength region than carbon and boron nitride, simultaneous removal of the catalyst metal during the growth of BNNTs 406 helps to improve the EUV transmission of the pellicle membrane.

A pellicle membrane 232 comprising a network of heterostructure nanotubes 250 is thus formed. The individual heterostructure nanotubes 250 are arranged randomly in the pellicle membrane 232 so that the heterostructure nanotubes 250 are not arranged along a major or predominant direction. The pellicle membrane 232 may have a thickness ranging from about 50 nm to about 100 nm. The thickness of the pellicle membrane 232 may be greater depending on the porosity of the pellicle membrane 232.

Figure 7:
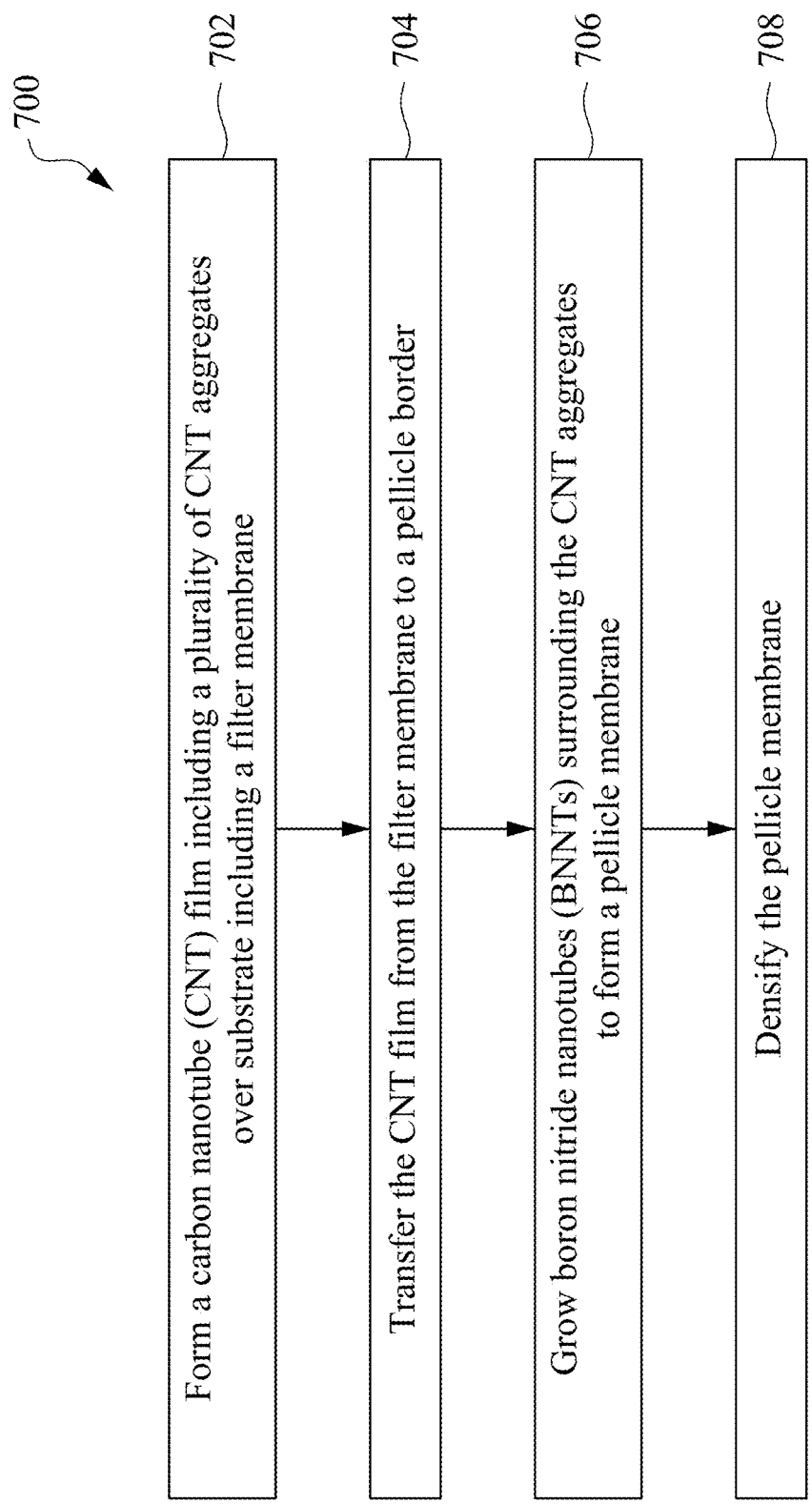
FIG. 7 is a flowchart of a method for fabricating a pellicle membrane assembly, in accordance with alternative embodiments.

FIG. 7 is a flowchart of a method 700 for fabricating the pellicle membrane assembly 230, in accordance with alternative embodiments of the present disclosure. FIGS. 8A-8D illustrate the pellicle membrane assembly 230 at various stages of the method 700. It is understood that additional steps can be provided before, during, and after the method 700, and some of the steps described below can be replaced or eliminated, for additional embodiments of the method. Unless specified otherwise, the materials and the formation methods of the components in these embodiments are essentially the same as their like components, which are denoted by like reference numerals in embodiments shown in FIGS. 6A-6D. The details regarding the formation process and the materials of the components shown in FIGS. 8A-8D are thus found in the discussion of embodiments shown in FIGS. 6A-6D.

Figure 8A:
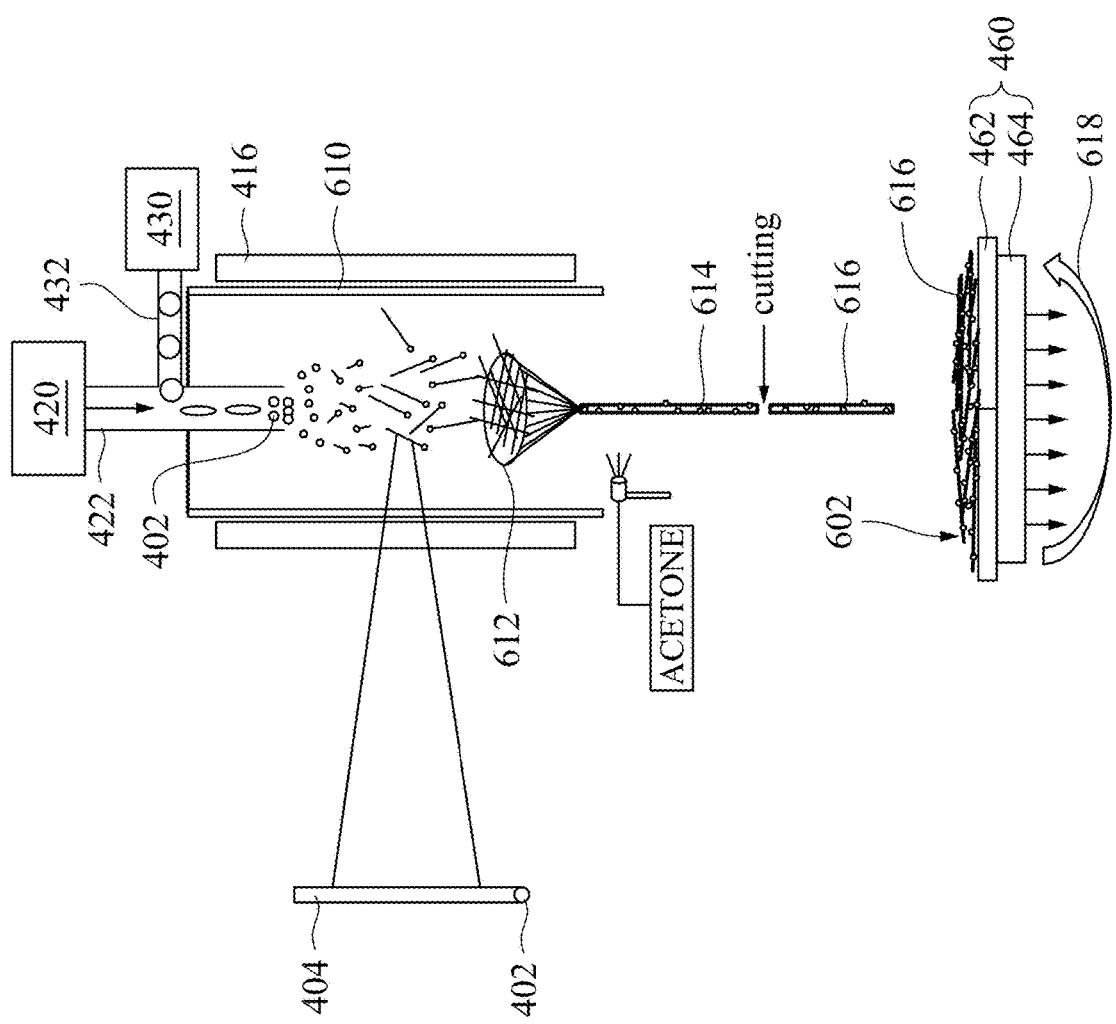
FIGS. 8A-8D illustrate the pellicle membrane assembly at various stages of the method of FIG. 7.
Figure 8B:
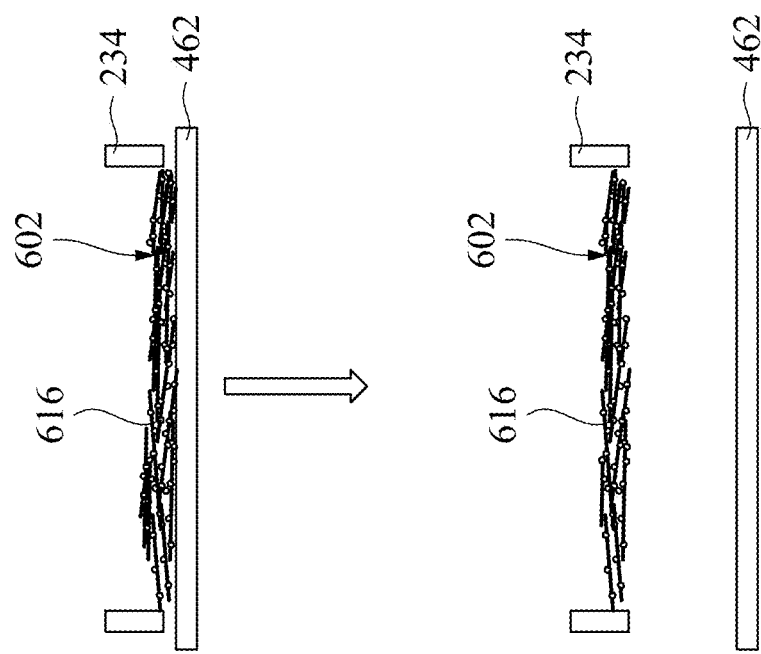
Figure 8C:
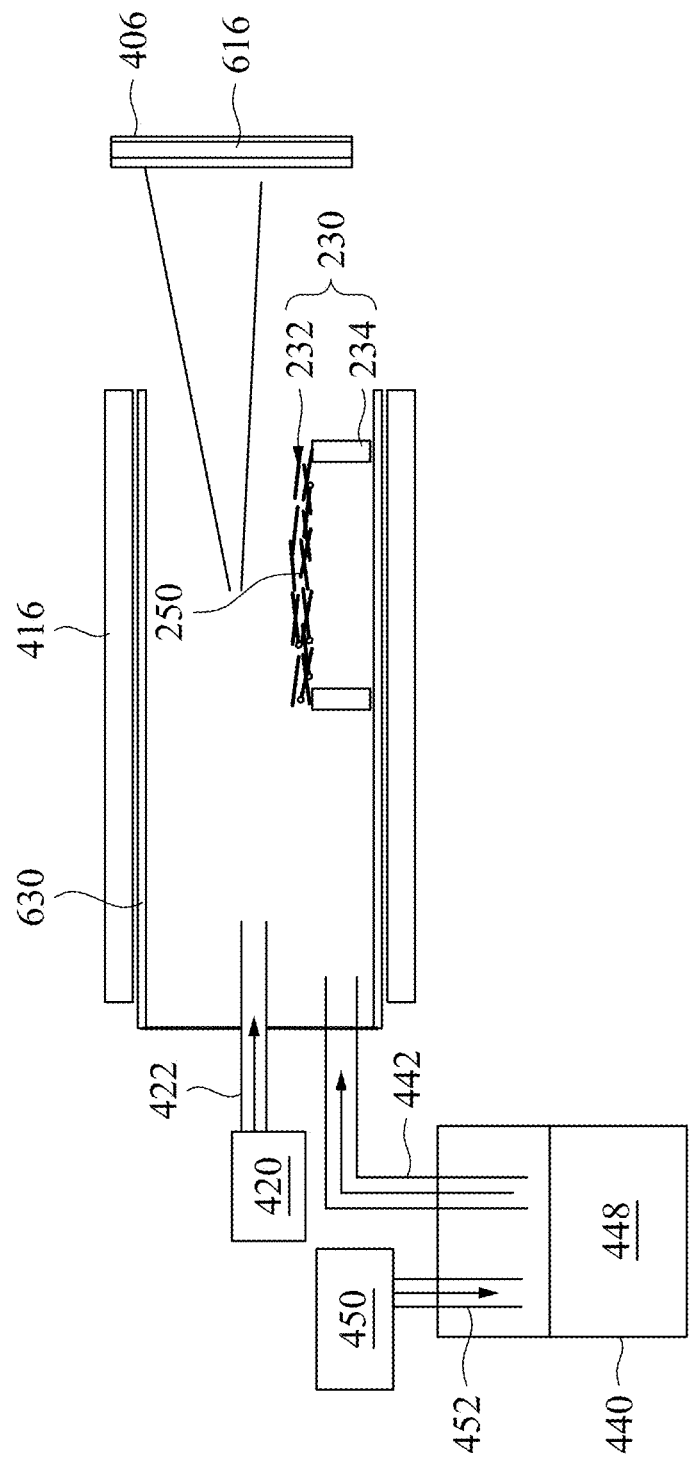
Figure 8D:
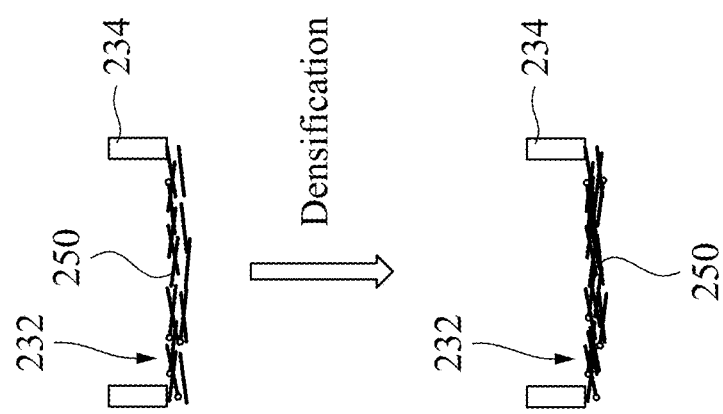

The operations of the method 700 are similar to operations of the method 500, except that after performing operation 702 to form a CNT film 602 including a plurality of CNT aggregates 616 over a filter membrane 462 (FIG. 8A) using processes described above with respect to FIG. 6A, and performing operation 704 to transfer the CNT film 602 from the filter membrane 462 to a membrane border 234 (FIG. 8B) using processes described above with respect to FIG. 6B, rather than performing operation 506 of method 500 to densify the CNT film 602, operation 508 of the method 500 is first performed in the method 700. As shown in FIG. 8C, in operation 706 of method 700, an assembly of the CNT film 602 and the membrane border 234 is placed inside the reactor 630, in which BNNTs 406 are formed surrounding the CNT aggregates 616, thereby providing a pellicle membrane 232 using processes described above with respect to FIG. 6D. The heterostructure nanotubes 250 in the pellicle membrane 232 contain less than 0.01 atomic % of catalyst metal. In some embodiments, the catalyst metal is completely removed so that the heterostructure nanotubes 250 are free of catalyst metal. In operation 708 of the method 700, the pellicle membrane 232 is densified (FIG. 8D) using processes described above with respect to FIG. 6C.

Subsequently, the pellicle membrane assembly 230 obtained in the method 300, 500 or 700 is attached to a pellicle frame 210 by the pellicle membrane adhesive 240 to form the pellicle 114. Next, the pellicle 114 is attached to the photomask 108 by the pellicle frame adhesive 214, thereby forming the pellicle-photomask structure 200 of FIG. 2. Processes for forming the pellicle 114 and the pellicle-photomask structure 200 are described above in FIG. 2.

One aspect of this description relates to a method for forming a pellicle for an extreme ultraviolet lithography. The method includes forming a pellicle membrane over a filter membrane and transferring the pellicle membrane from the filter membrane to a membrane border. Forming the pellicle membrane includes growing carbon nanotubes (CNTs) from in-situ formed metal catalyst particles in a first reaction zone of a reactor, each of the CNTs including a metal catalyst particle at a growing tip thereof, growing boron nitride nanotubes (BNNTs) to surround individual CNTs in a second reaction zone of the reactor downstream of the first reaction zone, thereby forming heterostructure nanotubes each including a CNT core and a BNNT shell, and collecting the heterostructure nanotubes on the filter membrane. The metal catalyst particles are partially or completely removed during growing the BNNTs.

Another aspect of this description relates to a method for forming a pellicle for an extreme ultraviolet lithography. The method includes growing carbon nanotube (CNT) aerogels from in-situ formed metal catalyst particles in a first reactor, each of the CNT aerogel including a metal catalyst particle at a growing tip thereof. The method further includes forming a CNT film over a substrate, the CNT film comprising CNT aggregates obtained by aggregating the CNT aerogels; attaching the CNT film to a membrane border; and growing boron nitride nanotubes (BNNTs) to surround individual CNT aggregates in a second reactor, thereby forming a pellicle membrane including a network of heterostructure nanotubes each including a CNT aggregate core and a BNNT shell. The metal catalyst particles are partially or completely removed during growing the BNNTs.

Still another aspect of this description relates to a lithography patterning method. The method includes reflecting an EUV radiation using a photomask with a pellicle membrane affixed on a pellicle holder on the photomask to a photoresist layer on a semiconductor substrate, developing the photoresist layer to form a patterned photoresist layer and etching the semiconductor substrate using the patterned photoresist layer as a mask to form a circuit layout. The pellicle membrane includes a first heterostructure nanotube layer having heterostructure nanotubes aligned in a first direction, and a second heterostructure nanotube layer having heterostructure nanotubes aligned in a second direction different from the first direction, thereby forming the grid of heterostructure nanotubes. Each of the heterostructure nanotubes includes a carbon nanotube (CNT) core and a boron nitride shell surrounding the CNT core.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a pellicle for an extreme ultraviolet lithography, comprising:
    forming a pellicle membrane over a filter membrane, wherein forming the pellicle membrane comprises:
        growing carbon nanotubes (CNTs) from in-situ formed metal catalyst particles in a first reaction zone of a reactor, each of the CNTs including a metal catalyst particle at a growing tip thereof;
        growing boron nitride nanotubes (BNNTs) to surround individual CNTs in a second reaction zone of the reactor downstream of the first reaction zone, thereby forming heterostructure nanotubes each including a CNT core and a BNNT shell, wherein the metal catalyst particles are partially or completely removed during growing the BNNTs; and
        collecting the heterostructure nanotubes on the filter membrane; and
    transferring the pellicle membrane from the filter membrane to a membrane border.

2. The method of claim 1, wherein the pellicle membrane comprises less than 0.01 atomic % of the catalyst metal.

3. The method of claim 2, wherein the pellicle membrane is free of the metal catalyst particle.

4. The method of claim 1, wherein growing the CNTs comprises:
    supplying a feedstock comprising a carbon source, a catalyst precursor and a catalyst promoter carried by a carrier gas into the first reaction zone of the reactor;
    heating the first reaction zone of the reactor to maintain a temperature gradient along a length of the first reaction zone;
    heating the catalyst precursor to cause decomposition of the catalyst precursor, thereby forming the metal catalyst particles; and
    heating the carbon source to cause decomposition of the carbon source catalyzed by the metal catalyst particles to provide carbon atoms and growth of the CNTs from the metal catalyst particles.

5. The method of claim 4, wherein the temperature gradient is from 500° C. to 1100° C.

6. The method of claim 4, wherein the carbon source comprises carbon monoxide, the catalyst precursor comprises ferrocence, and the catalyst promoter comprises thiophene.

7. The method of claim 4, wherein the carrier gas comprises hydrogen.

8. The method of claim 1, wherein growing the BNNTs comprises:
    heating a boron nitride source in a source material supply unit to sublime the boron nitride source;
    supplying the vaporized boron nitride source carried by a carrier gas into the second reaction zone of the reactor; and
    heating the vaporized boron nitride source to cause decomposition of the boron nitride source to provide boron nitride and conformal deposition of boron nitride on the CNTs.

9. The method of claim 8, wherein the boron nitride source comprises aminoborane, ammonia borane, borazine or combinations thereof.

10. The method of claim 8, wherein the decomposition of the boron nitride source is performed at a temperature ranging from 1000° C. to 1100° C.

11. The method of claim 1, further comprising densifying the pellicle membrane.

12. A method for forming a pellicle for an extreme ultraviolet lithography, comprising:
    growing carbon nanotube (CNT) aerogels from in-situ formed metal catalyst particles in a first reactor, each of the CNT aerogels including a metal catalyst particle at a growing tip thereof;
    forming a CNT film over a substrate, the CNT film comprising CNT aggregates obtained by aggregating the CNT aerogels;
    attaching the CNT film to a membrane border; and
    growing boron nitride nanotubes (BNNTs) to surround individual CNT aggregates in a second reactor, thereby forming a pellicle membrane including a network of heterostructure nanotubes each including a CNT aggregate core and a BNNT shell, wherein the metal catalyst particles are partially or completely removed during growing the BNNTs.

13. The method of claim 12, further comprising densifying the CNT film to form a CNT membrane comprising dense CNT aggregates before growing the BNNTs.

14. The method of claim 13, wherein densifying the CNT film comprises exposing the CNT film to ethanol.

15. The method of claim 12, further comprising densifying the pellicle membrane by exposing the pellicle membrane to ethanol.

16. The method of claim 12, wherein the pellicle membrane comprises less than 0.01 atomic % of the metal.

17. The method of claim 12, wherein forming the CNT film comprises:

forming a CNT fiber by spinning the CNT aerogels to aggregate the CNT aerogels, cutting the CNT fiber into a plurality of fiber pieces, each piece of the plurality of fiber pieces comprising the CNT aggregates; and collecting the plurality of fiber pieces by the substrate.

18. A lithography patterning method, comprising:

reflecting an EUV radiation using a photomask with a pellicle membrane affixed on a pellicle holder on the photomask to a photoresist layer on a semiconductor substrate;

developing the photoresist layer to form a patterned photoresist layer; and etching the semiconductor substrate using the patterned photoresist layer as a mask to form a circuit layout, wherein the pellicle membrane comprises a first heterostructure nanotube layer having heterostructure nanotubes aligned in a first direction, and a second heterostructure nanotube layer having heterostructure nanotubes aligned in a second direction different from the first direction, thereby forming a grid of heterostructure nanotubes, each of the heterostructure nanotubes comprising a carbon nanotube (CNT) core and a boron nitride shell surrounding the CNT core.

19. The method of claim 18, wherein the CNT core comprises more than 10 individual CNTs joined both side-by-side and end-to-end.

20. The method of claim 18, wherein the boron nitride shell comprises 1 to 40 layers of boron nitride.

* * * * *